United States Patent [19]
Moresco

[11] Patent Number: 6,111,756
[45] Date of Patent: Aug. 29, 2000

[54] UNIVERSAL MULTICHIP INTERCONNECT SYSTEMS

[75] Inventor: Larry L. Moresco, San Carlos, Calif.

[73] Assignee: Fujitsu Limited, Japan

[21] Appl. No.: 09/151,575

[22] Filed: Sep. 11, 1998

[51] Int. Cl.[7] ................................................. H05K 7/02
[52] U.S. Cl. ...................... 361/735; 361/794; 361/810; 361/683; 361/803; 361/792; 257/786; 257/723; 257/724; 439/65; 439/69; 439/74; 174/250; 174/261
[58] Field of Search ................................. 361/735, 794, 361/810, 683, 778, 777, 803, 792, 729, 730, 731, 784, 679; 257/786, 686, 777, 723, 724, 730; 439/65, 68, 69, 74; 174/265, 261, 250

[56] References Cited

U.S. PATENT DOCUMENTS

| | | | |
|---|---|---|---|
| 3,388,301 | 6/1968 | James ........................................ | 317/234 |
| 4,202,007 | 5/1980 | Dougherty et al. ........................ | 357/80 |
| 4,458,297 | 7/1984 | Stopper et al. ........................... | 361/403 |
| 4,631,572 | 12/1986 | Zimmerman ............................. | 357/74 |
| 4,710,798 | 12/1987 | Marcantonio ............................. | 357/80 |
| 4,774,630 | 9/1988 | Reisman et al. .......................... | 361/383 |
| 4,811,082 | 3/1989 | Jacobs et al. ............................. | 357/80 |
| 4,866,508 | 9/1989 | Eichelberger et al. .................... | 357/74 |
| 4,930,002 | 5/1990 | Takenaka et al. ......................... | 338/96 |
| 5,066,831 | 11/1991 | Spielberger et al. .................... | 174/52.4 |
| 5,073,816 | 12/1991 | Wakefield et al. ........................ | 357/74 |
| 5,081,563 | 1/1992 | Feng et al. ................................ | 361/414 |
| 5,101,323 | 3/1992 | Prevost ..................................... | 361/394 |
| 5,164,814 | 11/1992 | Okumura ................................. | 257/390 |
| 5,198,963 | 3/1993 | Gupta et al. .............................. | 361/386 |
| 5,200,810 | 4/1993 | Wojnarowski et al. ................. | 361/750 |
| 5,220,490 | 6/1993 | Weigler et al. ........................... | 361/409 |
| 5,241,456 | 8/1993 | Marcinkiewicz et al. .............. | 361/792 |
| 5,257,166 | 10/1993 | Marui et al. ............................. | 361/760 |
| 5,272,600 | 12/1993 | Carey ........................................ | 361/792 |
| 5,391,914 | 2/1995 | Sullivan et al. .......................... | 257/635 |
| 5,426,563 | 6/1995 | Moresco et al. .......................... | 361/689 |
| 5,426,566 | 6/1995 | Beilstein, Jr. et al. ................... | 361/735 |
| 5,691,885 | 11/1997 | Ward et al. ............................... | 361/735 |
| 5,854,534 | 12/1998 | Beilin et al. .............................. | 257/691 |
| 5,857,858 | 1/1999 | Gorowitz et al. ......................... | 439/86 |
| 5,905,639 | 5/1999 | Warren ..................................... | 361/776 |
| 5,935,687 | 8/1999 | Davidson et al. ........................ | 428/195 |
| 6,002,592 | 12/1999 | Nakamura et al. ....................... | 361/760 |

*Primary Examiner*—Leo P. Picard
*Assistant Examiner*—David Foster
*Attorney, Agent, or Firm*—Coudert Brothers

[57] ABSTRACT

A universal multi-chip interconnect system using a set of at least two types of standardized interconnect components is disclosed. One of the component types comprises a chip carrier capable of holding at least one IC chip in a first portion thereof and providing a plurality of standardized interconnections from the first portion to one or more second portions of the carrier, where one or more interconnect components of a different type may be connected. Another of the component types comprises a bridge connector which is capable of connecting to two or more chip carriers at their second portions. Each bridge connector has at least two interconnect portions which are capable of connecting to chip carriers at their second portions, and a standardized pattern of interconnect wires between the interconnect portions. Once a set of chip carriers and bridge carriers are assembled in a desired arrangement, a plurality of potentially-active interconnect paths are formed, the total number of which exceeds the number interconnection paths needed by the system. The particular selection of the interconnect paths needed to implement the system's interconnection is accomplished by routing the I/O signals of each IC chip to the pads of the carrier which are coupled to interconnect paths which will provide the desired system interconnectivity. The routing may be accomplished by customizing the interconnect-metalization layer of the and/or by forming a customized pattern of solder bumps (or equivalent connectors) between the IC chip and the surplus-pad chip carrier, and/or other methods disclosed herein.

45 Claims, 19 Drawing Sheets

22 — Diamond

22 — X Shape

22 — + Shape (plus)

22 — Windmill

UNIVERSAL MULTICHIP INTERCONNECT SYSTEMS

FIELD OF THE INVENTION

The present invention generally relates to the packaging and interconnection of the components of an electronic system, and more particularly to the packaging and interconnection of IC chips in computer systems and the like.

BACKGROUND OF THE INVENTION

A conventional approach to building a multichip computer system comprises the steps of designing and fabricating a set of integrated circuits based on the system's architecture, finding or building carrier packages for the IC chips, and creating a custom routed circuit board (e.g., printed wiring board) to interconnect the IC chips, or alternatively creating a custom routed multichip module that houses the IC chips. In general, the tasks of providing carrier packages and interconnections between the IC chips is given secondary priority to the designing of the IC chips. Further, these tasks are generally given little, if any, consideration in the design of the IC chips. As one example, the assignment of signal lines to the chip's available I/O pads is primarily determined by the chip's circuitry and the desire to reduce the surface area needed to implement the circuitry. Secondary consideration, if any, is given to how the assignment of signal lines to the I/O pads might affect the cost, yield, and manufacturability of the IC chip packaging and interconnection.

Great emphasis has been placed on laying-out the circuitry to minimize area so as to reduce manufacturing costs and increase chip yields by obtaining more IC chips per wafer. It is generally believed in the art that the packaging costs are lower than the costs of manufacturing the IC chips. However, the packaging often has to be re-worked to replace malfunctioning IC chips or to repair bad connection points. The IC chips are usually tested with only DC or slow-speed signals generated by a testing unit, and are not tested with the types of high-speed signals present in the system. Therefore, even though an IC chip may pass the "DC" test, it may malfunction in the system. Additionally, the IC chips are usually attached to test substrates for the testing. After testing, the chips are de-attached and subsequently attached to carrier substrates or MCM modules. The detachment and subsequent attachment processes can damage the interconnect pads or the chip, resulting in a malfunctioning chip. Significant time can be spent locating malfunctioning chips and defective connections in the assembled system. This time, and the time spent re-working, add significant hidden costs to the packaging tasks, and are often overlooked when comparing chip manufacturing costs to packaging costs.

There has been some suggestions in the art that a universal interconnect substrate could be created which could be customized by fusing and/or bonding wires on the surface of the universal interconnect substrate to provide a customized set of interconnections to the IC chips. Unfortunately, these suggestions usually are not manufacturable or do not have enough wiring density to be successful.

The above packaging issues apply not only to multi-chip computer systems, but to special electronic processors and other electronic systems requiring the interconnection of several IC chips (including analog systems and hybrid digital/analog systems).

SUMMARY OF THE INVENTION

The inventor has recognized that the costs of providing carrier packages and interconnections between the IC chips is comparable to, and sometimes exceeds, the costs of manufacturing the IC chips, given the average amount of testing and re-working required. The present invention recognizes that the cost of customizing the pad interconnect metalization layer of an IC chip, or forming an additional interconnect metalization layer, is substantially less than the cost of creating a customized wire pattern with chip carriers and chip modules, and can be done with a small decrease in IC chip yield. Using a customized routing interposer can also be less expensive. The present invention further recognizes that the use of a set of standardized interconnect components can reduce the cost of assembling multichip modules, can increase the yield of the modules, and can increase production volume by simplifying the assembly process. In the present invention, the standardized interconnect components provide many more connection paths than required by the IC chip system. The selection of which paths are used by a particular system is accomplished by customizing the wire routing pattern between at least one IC chip and the interconnection component to which it is attached.

Broadly stated, the present invention encompasses a universal interconnect system comprising a set of at least two types of standardized interconnect components, each standardized component capable of being connected to at least one other standardized component. At least one of the component types comprises a chip carrier capable of holding at least one IC chip in a first portion thereof and providing a plurality of standardized interconnections from the first portion to one or more second portions of the carrier where one or more interconnect components of a different type may be connected. At least one other of the component types comprises a bridge connector which is capable of connecting to two or more chip carriers at their second portions. Each bridge connector has at least two interconnect portions which are capable of connecting to chip carriers at their second portions, and a standardized pattern of interconnect wires between the interconnect portions.

Once a set of chip carriers and bridge carriers are assembled in a desired arrangement, a plurality of potentially-active interconnect paths are formed, many of the interconnect paths each comprising an interconnect wire in a chip carrier and in a bridge connector. The total number of potentially-active interconnect paths provided by the assembled interconnect components exceeds the number interconnection paths needed by the system. At least one chip carrier in the system provides more interconnection pads for its IC chip than the number of I/O signals of its IC chip. This carrier and its corresponding chip are referred to as the surplus-pad carrier and the surplus-pad IC chip, respectively. Each of the surplus pads is coupled to a potentially-active interconnect path. The selection of the interconnect paths needed to implement the system's interconnection is then accomplished by routing the I/O signals of the surplus IC chip to those surplus pads of the carrier which are coupled to the desired interconnect paths. The routing may be accomplished by "customizing" the interconnect-metalization layer of the surplus-pad IC chip, by connecting the EC chip to the surplus-pad chip carrier with an interposer having customized interconnections, by forming a customized pattern of solder bumps (or equivalent connectors) between the IC chip and the surplus-pad chip carrier, or by a combination of one or more of these steps. Complex systems may have more than one surplus-pad carrier.

The task of creating the customized routing pattern for selecting the interconnection paths needed by the system can be performed by mental thought with the exemplary embodiments provided below. The routing patterns for a number of computer systems were determined with mental thought and without undue experimentation. Of course, such routing tasks can be readily handled by the computerized routing techniques used for the layout of circuitry on an IC chip and the layout of traces on a printed circuit board.

The standardized interconnect components can be used in a wide range of multichip systems, and can therefore be manufactured in large volumes. Large scale production enables substantial reduction of manufacturing costs.

In one embodiment of the present invention, at least one jumper between surplus pads of a surplus-pad carrier is formed on the metalization layer of the corresponding chip so as to route a signal from one bridge connector to another bridge connector. When the bridge connectors are coupled to carriers having other chips, the jumper between these surplus-pads can create a signal path between two other IC chips.

In one embodiment of the present invention, the bridge connectors are flexible and enable an arrangement of chip carriers and bridge connectors to flex. The array may then be contacted to a cold plate of a cooling system such that each chip may be contacted to the cold plate despite variations in chip thickness and planarity.

In one embodiment of the invention, the IC chips are attached to their respective universal-type chip carriers prior to testing. Test equipment adapted to attach to the carriers with bridge connectors is used to test the attached chips with high-speed signals (so called "at-speed" testing) that will be encountered in the final assembled system. The potentially destructive detachment and subsequent attachment steps are avoided. Should the assembled IC chip and carrier fail, the entire assembly may be discarded with little economic loss due to the fact that the chip carrier can be manufactured at low cost owing to its standardization. With each interconnect component tested before assembly, the manufacturing yield of the assembled system can be significantly higher than that of a conventional multichip module.

Accordingly, an object of the present invention is to provide a universal interconnect system for integrated circuit chips.

Another object of the present invention is to reduce the cost of manufacturing multichip modules (MCM's).

Yet another object of the present invention is to increase the yield of multichip module assemblies.

Still another object of the present invention is to increase the production volume of multichip modules.

DETAILED DESCRIPTION OF THE INVENTION

An integrated circuit chip comprises a set (or group) of circuits and a plurality of interconnection pads disposed on one of its two major surfaces. Some of the pads carry input signals to the circuits, others convey output signals generated by the circuits in response to the input signals, and still other pads convey power and ground potentials. Complex electronic digital systems often have their circuitry partitioned among several IC chips, with signal lines running between the input and output pads of the IC chips.

The IC chips are generally attached to a common wiring board, or equivalent means, which provides power to the chips and which has signal traces which serve to connect up the signal lines between the IC chips (i.e., the traces connect up the pads of the IC chips to each other in the manner specified by the functions of the circuits). The configurations of the signal lines among the IC chips of typical electronic systems generally have a random and irregular character. In other words, there usually is not a common pattern of signal lines for each IC chip, and each system has a different configuration. The irregularity in the configuration requires that the configuration of traces in the wiring board be irregular, which in turn requires that the trace layout of the wiring board be customized for each system. Many of the IC chips in such a system are substantially different from one another.

As one goal, the present invention seeks to enable the interconnection of systems with complex and irregular signal-line configurations without the need for complicated custom interconnect wiring boards. This is achieved in the present invention by replacing the customized wiring board with a plurality of universal chip carriers and bridge interconnectors which collectively provide many more signal traces than needed by the system. Each carrier holds one or more chips and provides many more interconnect pads to the chips than needed, and each bridge connector interconnects signal pads of one carrier to at least another carrier. The implementation of the unique signal-line configuration of a specific system is achieved by customizing a metalization layer of each IC chip to select a subset of the available signal traces to implement the configuration. This generally involves re-routing each input and output pad of each chip to contact a pad on the universal carrier which will effect the desired signal trace connection needed for the particular pad. A single type of universal chip carrier may be used throughout the system, or a small number of carrier types may be used, each having specific features for certain categories of chips (e.g., memory chips, arithmetic chips). These specific features may relate to power consumption and power filtering requirements, which are not particularly related to the signal wiring pattern.

Figure 1:
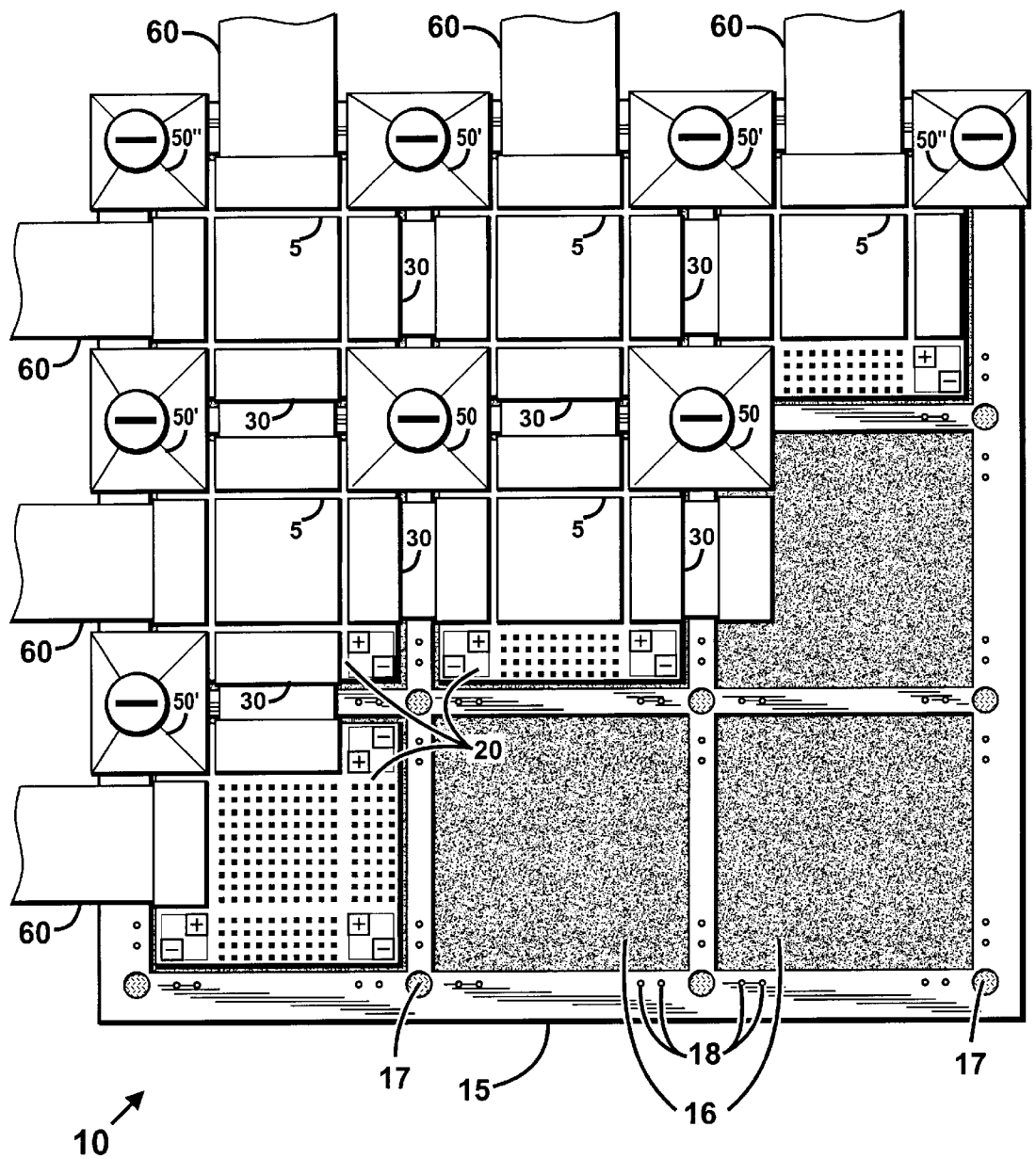
FIG. 1 is a top plan view of a first exemplary embodiment of the universal multichip interconnection system according to the present invention.
Figure 2:
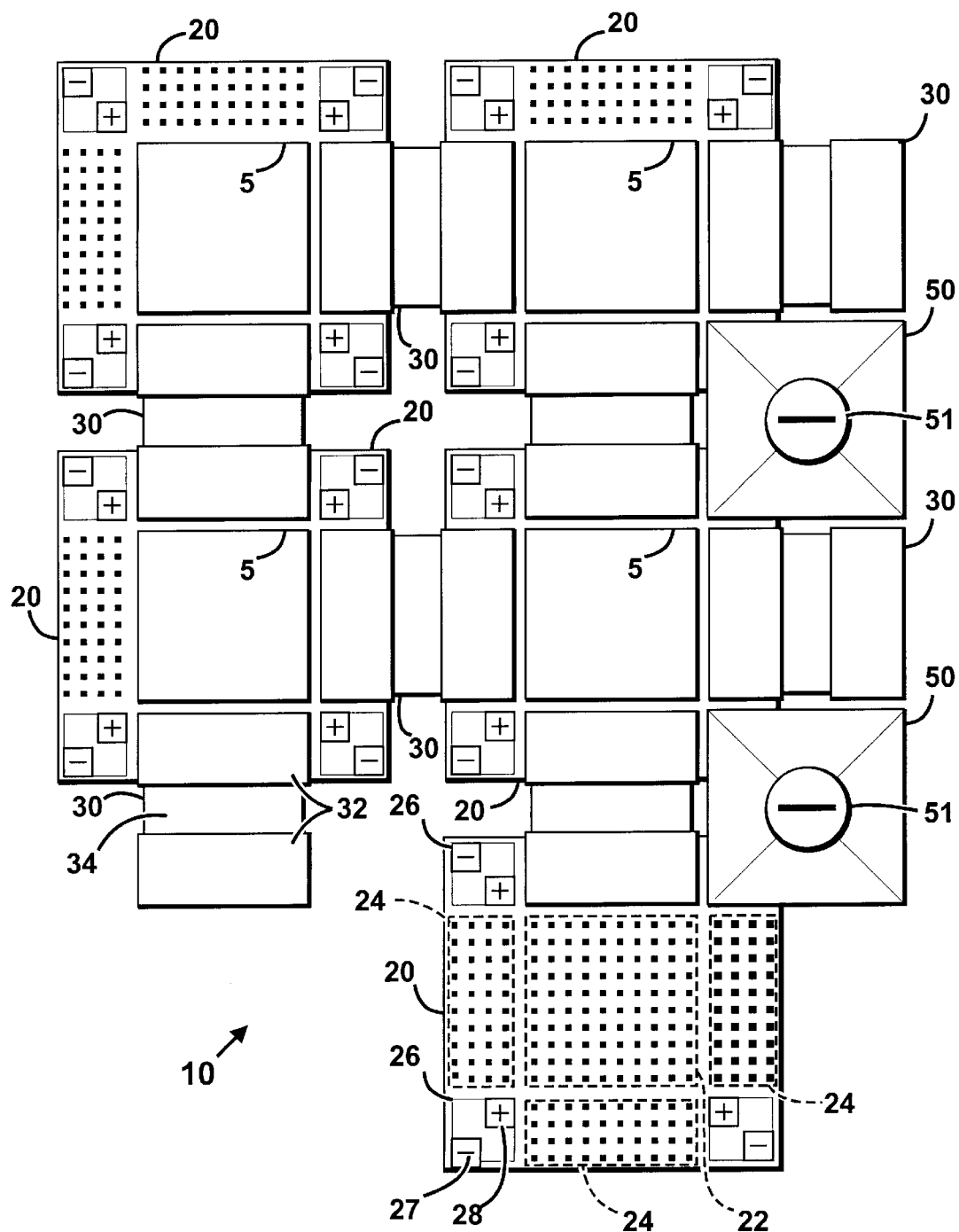
FIG. 2 is a top plan view of selected components of the system shown in FIG. 1 according to the present invention.

A first embodiment of the universal multichip interconnection system according to the present invention is shown at 10 in FIG. 1. System 10 comprises a main board 15, a plurality of universal chip carriers 20, a plurality of bridge interconnectors 30, and a plurality of power connectors 50. These components are arranged in a quilt-like pattern over main board 15, generally with each bridge interconnector 30 disposed between the edges of two adjacent chip carriers 20 and attached thereto, and a power connector 50 disposed at one or more corners of each carrier 20. A more clear picture of system 10 is shown in FIG. 2, where main board 15 and some of power connectors 50 are not shown for visual clarity.

IC chips 5, usually one per carrier, are attached to the carriers 20. Five carriers, with one IC chip each, are shown in FIG. 1. Carrier 20 comprises an array of interior pads 22 for attaching to an IC chip 5 (FIG. 2), and four arrays of outer pads 24, each array for attaching to a corresponding array of pads of a bridge interconnector 30, or the like. Universal chip carriers 20 may be designed to accept one large chip, or two or more smaller chips. Each bridge interconnector 30 bridges across two adjacent chip carriers 20, and conveys signals therebetween. Power connectors 50 connect to the corners of carriers 20, and may connect to one, two, three, or four carriers. Each carrier 20 has at least one power connector 50 coupled to it. Power connectors 50 can connect up to four carriers, side power connectors 50' (FIG. 1) can connect up to two carriers, and corner power connectors 50" can connect to one carrier.

A plurality of external interconnectors 60 (FIG. 1) are attached to selected carriers 20 at the outer pad arrays 24 thereof. External interconnectors 60 carry external input signals to system 10 and convey output signals from system 10 to various external components. The construction of interconnectors 60 may be similar to that of bridge interconnectors 30, as described below.

In a preferred implementation, main board 15 comprises a plurality of recesses 16 (FIG. 1), each for receiving a chip carrier 20, and a plurality of apertures 17 disposed at the vertices of recesses 16, each aperture 17 for receiving a screw fastener 51 of a power connector 50. Around each aperture 17 are at least two power plugs 18 formed in main board 15, each power plug 18 for receiving a power pin of a power connector 50. Power, in the form of a power voltage and a ground voltage, are provided within main board 15, and routed to plugs 18 by way of electrical traces. Power is routed from the pins of power connector 50 to power pads at the corners (vertices) of carriers 20 by way of electrical traces within connector 50. Main board 15 and power connector 50 may be fabricated with standard printed circuit board components and laminating techniques.

Power Connectors and Bride Connectors

Figure 3:
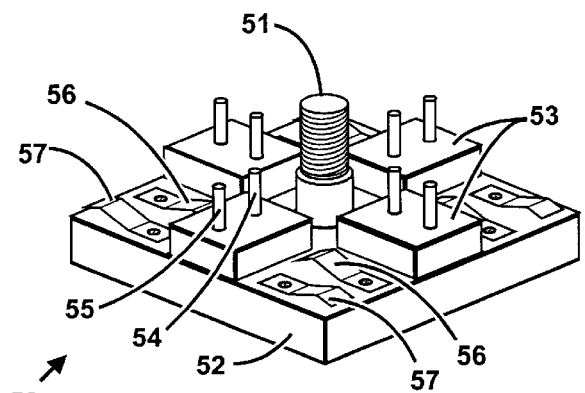
FIG. 3 is a perspective view of the bottom surface of an exemplary power connector according to the present invention.
Figure 4:
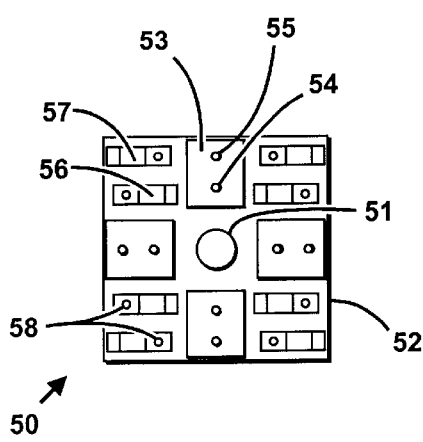
FIG. 4 is a bottom plan view of the exemplary power connector shown in FIG. 3 according to the present invention.

A perspective view of the bottom surface of a power connector 50 is shown in FIG. 3 and a bottom plan view thereof is shown in FIG. 4. Connector 50 comprises a rectangular base substrate 52 which has electrical routing traces and a center aperture through which fastener 51 passes, and four base pedestals 53 symmetrically disposed about fastener 51 and at respective sides of substrate 52. On each base pedestal 53 is disposed a power voltage pin 54 and a ground pin 55, each of which plug into respective power plugs 18 of main board 15. A first set of leaf-spring contacts 56 (or equivalent structures) are disposed at the corners of connector 50, and are for contacting corresponding power voltage pads 28 of chip carriers 20. Each contact 56 is electrically coupled to at least one pin 54 by an electrical trace within substrate 52. A second set of leaf-spring contacts 57 (or equivalent structures) are disposed at the corners of connector 50, and are for contacting corresponding ground pads 27 of chip carriers 20. Each contact 57 is electrically coupled to at least one pin 55 by an electrical trace within substrate 52. Contacts 56 and 57 are attached to substrate 52 by fasteners or welds, as shown at 58 (FIGS. 3 and 4). Base pedestals 53 ensure that minimum spacing distances between carriers 20 are achieved, and ensure that fastener 51 cannot apply excessive force to leaf-spring contacts 56 and 57. Additional voltage levels may be included by adding additional pins (like those indicated at 54 and 55) and additional leaf-spring contacts (like those indicated at 55 and 56).

Connectors 50' and 50" comprise similar elements and are constructed in a similar manner. Connector 50' has three pedestals 53 and connector 50" has two.

Figure 6:
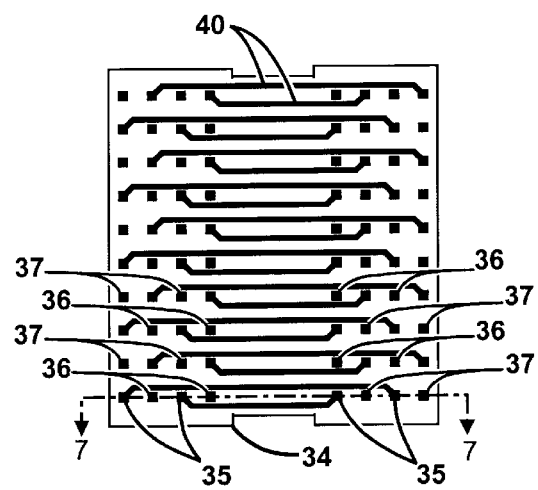
FIG. 6 is a top plan view of the flexible signal layer of the bridge interconnector shown in FIG. 5 according to the present invention.
Figure 5:
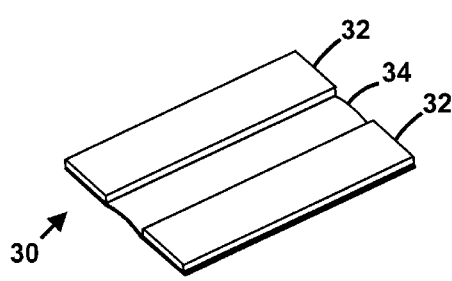
FIG. 5 is a perspective view of an exemplary bridge interconnector according to the present invention.

FIG. 5 shows an isometric view of a bridge interconnector 30, which comprises two distal members 32 and a flexible signal layer 34 disposed between members 32. Flexible signal layer 34 comprises a plurality of connection pads under each distal member 32 for attachment to corresponding outer pads 24 of a chip carrier 20. Distal members 32 are preferably more rigid than signal layer 34, and signal layer 34 is sufficiently flexible to enable members 32 to move relative to one another. FIG. 6 shows a top plan view of a portion of the flexible signal layer 34 of the bridge connector 30 shown in FIG. 5. The portion 34 comprises a layer of dielectric and a patterned conductor layer thereover, and shows an exemplary routing of signal lines between two connection areas. Layer portion 34 comprises an array of pads 35–37 at its left side and a second array of pads 35–37 at its right side. Each array of pads underlies and is supported by a corresponding member 32.

Pads 35 carry signals, pads 36 carry a power potential, and pads 37 carry a ground potential. The signal pads 35 at each side are alternated in a "checkerboard" fashion with the power and ground pads 36 and 37. Generally, a signal pad 35 at the left side is routed to a corresponding signal pad 35 on the right side by a respective trace 40. However, it may be convenient to route a signal pad 35 on the left side to two or more signal pads 35 on the right side (and vice versa) for particular applications. The power pads 36 and ground pads 37 are disposed in alternate rows, as shown in FIG. 6. Other arrangements of power pads 36 and ground pads 37 are possible, and the arrangement thereof is not important in practicing the present invention.

Figure 7:
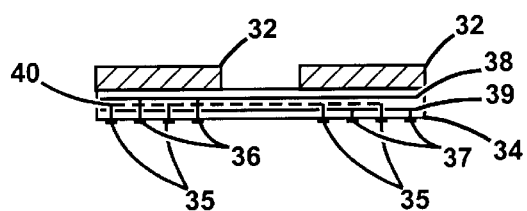
FIG. 7 is a cross-sectional view of the bridge interconnector shown in FIG. 5 according to the present invention.

Referring to FIG. 7, which is a cross-sectional view of the bridge interconnector 30 through the plane 7—7 shown in FIG. 6, the traces 40 are disposed on one or more dielectric layers, and are covered by a top dielectric layer. A first AC-ground plane 38 is disposed above these dielectric layers. Ground plane 38 is coupled to the ground potential through pads 37. A second AC-ground plane 39 is disposed below the dielectric layers. Second AC-ground plane 39 is coupled to the power potential through pads 36.

Connector 30 may be formed by conventional thick-film and thin-film methods. The method disclosed in U.S. Pat. No. 5,426,563 to Moresco, et al., entitled "Three-Dimensional Multichip Module" is currently preferred. The dielectric layers, planes 38 and 39, traces 40, and pads 35–37 are built up on a silicon wafer with copper/polyimide processing. Alternating polyimide and copper layers are formed and patterned to produce the structure shown in FIG. 7. The silicon wafer is then etched from the opposite side to form members 32 from the silicon material. The thicknesses of the dielectric layers, the widths of traces 40, and the spacing of traces 40 from each other and from the ground planes are chosen according to well-known prior art teachings to provide a desired level of characteristic impedance. Each trace 40 preferably has the same characteristic impedance as the other traces, and the impedance is controlled to be within close tolerance of the desired level. 50 ohms is a common value of characteristic impedance, but other values may be used. Preferably, the input and output circuits coupled to the ends of the traces have input and output impedance, respectively, that are close to the characteristic impedance value. Pads 35–37 may be coupled to corresponding pads 24 of the chip carriers 20 by a number of means known to the art, such as $C^4$ solder bumps or wire-interconnect-technology (WIT) connectors, as described in U.S. Pat. No. 5,334,804 to Love, et al., entitled "Wire Interconnect Structures for Connecting an Integrated Circuit to a Substrate."

Universal Chip Carriers

In contrast to the conventional methods of interconnection, the signal routing in each universal carrier 20 is not customized to a specific IC chip, but yet is capable of accommodating chips with substantially different circuitry. More specifically, each carrier 20 has an amount of inner signal pads 22 (FIGS. 1 and 2) in excess of that needed by any of the chips that it can accommodate, and a corresponding amount of signal traces between inner pads 22 and outer pads 24 in excess of that needed by the chips. The number of pads in inner array 22 may generally exceed the number needed by the integrated circuit chip (or formed on the chip) by a factor of two, more preferably by a factor of three or more. The signal lines are provided in a predetermined symmetric pattern such that each carrier has at least 180-degree rotational symmetry, and preferably 90-degree rotational symmetry. With the 90-degree symmetry, the rotational placement of the chip on the carrier is not important, thereby greatly simplifying the assembly process. The assembly process need only align one edge of the IC chip to any edge of the carrier. In the case of a carrier having 180 degrees symmetry, an identification of a specific edge of the carrier during assembly of the chip to the carrier is usually required.

Also in contrast to the conventional interconnection methods, the routing of the entire system's signals may be accomplished by including customized routing patterns on the last metalization layers, which are usually the pad metalization layers, of the IC chips. In effect, the positions of the IC pads are rearranged to match appropriate signal traces on carriers 20, and then a metal trace is run from each pad's new position to its original position, where the trace contacts the next IC interconnect layer below by way of a via. The cost of customizing the IC pad layer in this manner is generally not substantial since the design of only one or two layers is involved, and is much less than custom designing an entire chip carrier system, which often entails several custom metalization levels. In simple systems and in systems where the major functional units (e.g., CPU, memory controller, I/O controller, memory) are partitioned on separate IC chips, the routing in the last metalization layer of the IC chip may be done by a circuit designer by hand or with the aid of a routing program. Exemplary chip placement and signal routing methods are described below after more fully describing carrier 20.

Figure 8:
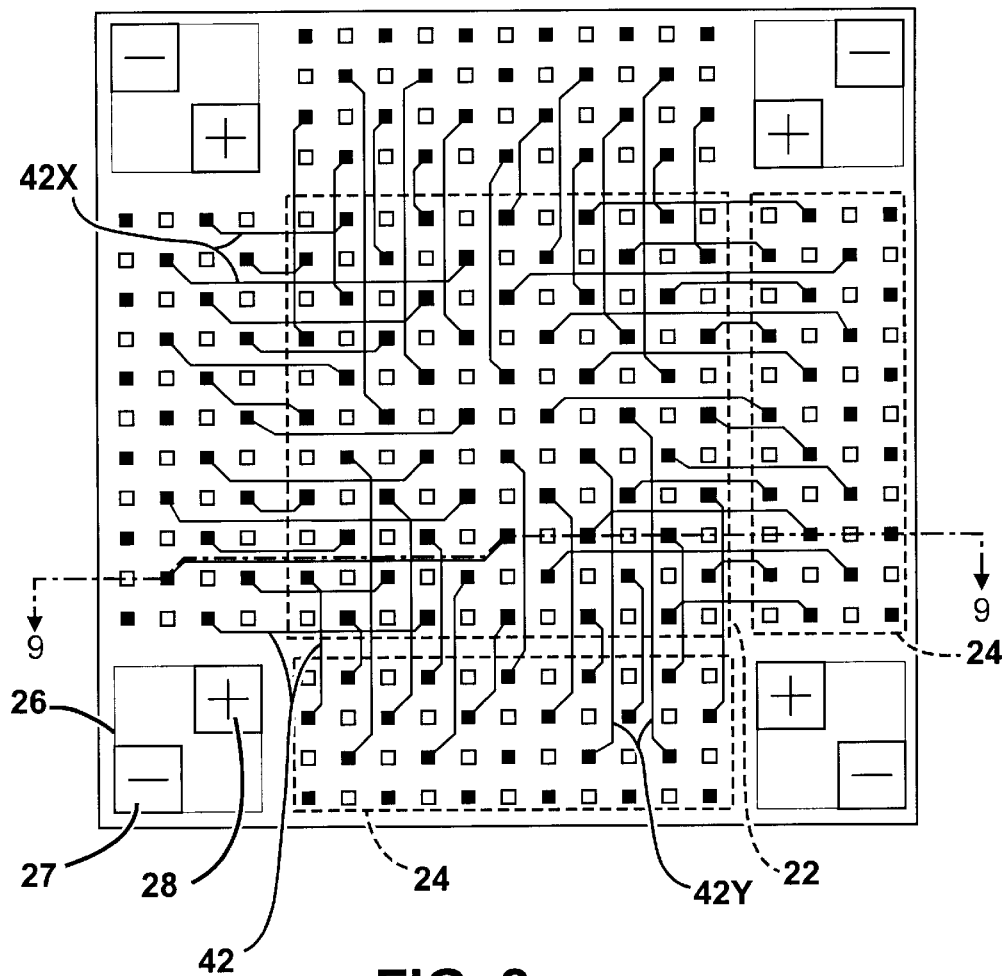
FIG. 8 is a top plan view of a first exemplary set of wiring traces which implement a first exemplary signal routing pattern according to the present invention.
Figure 10:
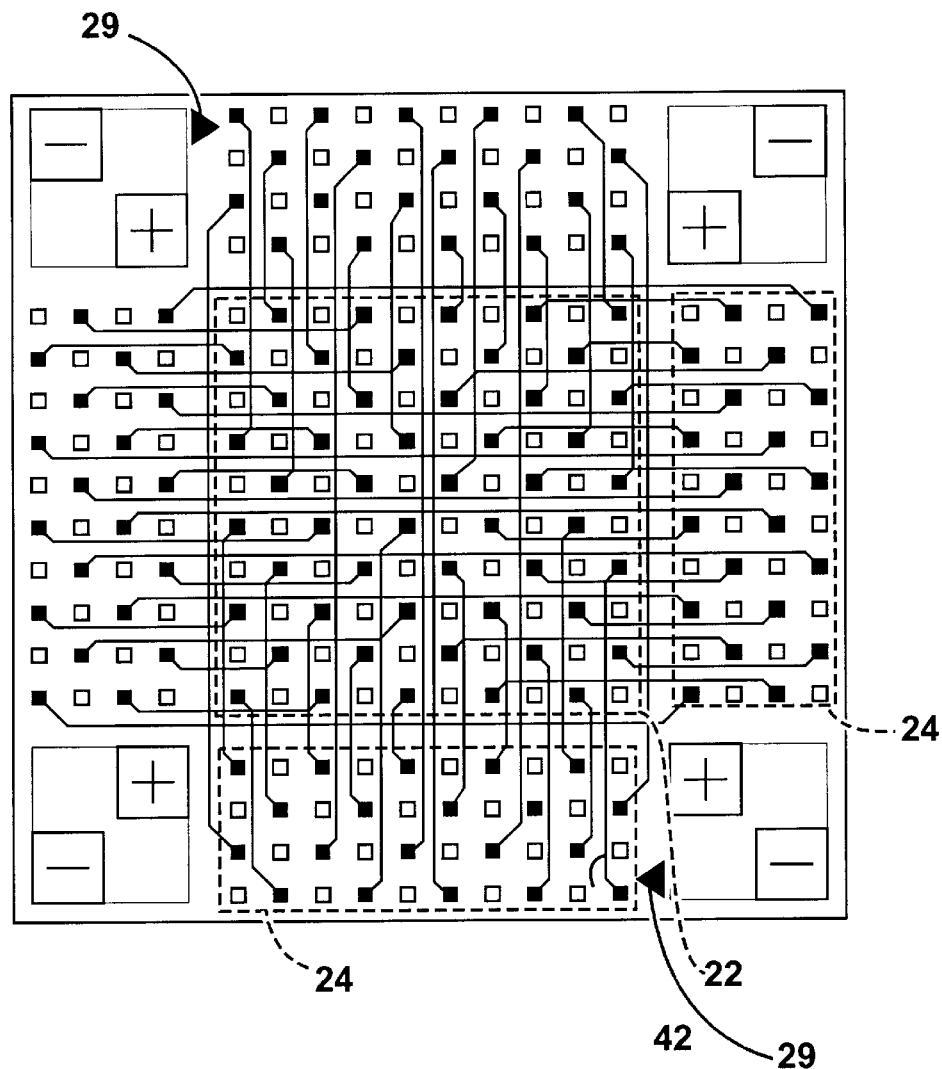
FIG. 10 is a top plan view of a second exemplary set of wiring traces which implement a second exemplary signal routing pattern according to the present invention.

FIGS. 8 and 10 show exemplary sets of signal traces for carrier 20 which run between the arrays of outside pads 24 and the array of inside pads 22. Pads with solid fill are signal pads, and pads with blank fill are power/ground pads. In both the inside and outside arrays 22 and 24, the signal pads (solid fill) are alternated in a "checkerboard" fashion with the power and ground pads (no fill). The alternating "checkerboard" arrangement is oftentimes referred to as a rectangular grid of pads with red-black ordering, in accordance with the colors of the squares on a checkerboard. The signal pads are located on squares of one color (red for example) and the power/ground pads are located on squares of the other color (black for example). The number of signal pads roughly equals the number of power supply pads (e.g., power or ground pads) in both the inside and outside arrays 22 and 24. In inside array 22, the signal pads are distributed substantially uniformly over the area of the inside array, as are the power supply pads. This leads to 10% to 25% of the signal pads being located closer to the center point of the inner array 22 than the perimeter of the inner array 22 (the perimeter may be defined as the outermost rectangle which just encloses all the pads of the inner array). In a similar manner, 10% to 25% of the power supply pads are located closer to the center point than the perimeter. In the outer arrays of pads 24, the power and ground pads (no fill) are disposed in alternate rows to match the alternating arrangement of the power and ground pads in interconnect bridges 30, as shown in FIG. 6. Various arrangements of power and ground pads within the inner array of pads 24 are described below.

The signal pads 22 of the inner array are routed to signal pads 24 in the outer arrays by a plurality of traces 42. Horizontal traces 42 are referred to as "X"-signal traces 42X, and vertical traces are referred to as "Y"-signal traces 42Y. In FIGS. 8 and 10, the "X"-signal traces and "Y"-signal traces are superimposed on top of one another for the purpose of showing all traces in a single view; "X"- and "Y"-signal traces which are shown in these figures as crossing one another are actually electrically isolated from each other at the crossing point. The "X"-signal traces may be formed in a single conductive layer, or plane, or may be distributed among several conductive layers. Likewise, the "Y"-signal traces may be formed in one or more conductive layers. Those signal traces which cross over one another are placed in separate conductive layers. This requirement can be readily met by segregating "X"-signal traces and "Y"-signal traces into separate layers.

Each signal pad 22 of the inner array is routed to at least one pad 24 in an outer array by a corresponding trace 42. The particular connection of inner pads 22 to outer pads by a set of traces 42 is referred to as a signal routing pattern. There are several possible signal routing patterns. Each routing pattern has a symmetric portion, and may have an asymmetric portion. The symmetric portion comprises a subset of pads 22 and 24 and connection traces 42 of the chip carrier which maintain the same signal connectivity between the chip carrier and neighboring chip carriers when the chip carrier is rotated by 90 degrees and/or 180 degrees with respect to the neighboring chip carriers. The asymmetric portion, if present, comprises a subset of the pads 22 and 24 and traces 42 which do not maintain the same signal connectivity when rotated by 90 degrees or 180 degrees. In currently preferred embodiments, carriers 20 do not have asymmetric signal routing portions, and only have symmetric signal routing portions. A symmetric signal routing portion having a 180-degree rotational symmetry can be rotated 180-degrees with respect to the neighboring chip carriers without causing a difference in the signal connectivity between it and the neighboring chip carriers. Likewise, a symmetric signal routing portion having a 90-degree rotational symmetry can be rotated 90 -degrees with respect to the neighboring chip carriers without causing a difference in the signal connectivity between it and the neighboring chip carriers. All symmetric signal routing patterns which have 90-degree rotational symmetry also have 180-degree rotational symmetry, but not all signal patterns which have 180-degree rotational symmetry have 90-degree rotational symmetry. The exemplary signal routing patterns shown in FIGS. 8 and 10 have 180-degree rotational symmetry (no asymmetric portions). The signal routing pattern shown in FIG. 8 also has 90-degree rotational symmetry (the one shown in FIG. 10 does not). For the routing patterns which only have 180-degree rotational symmetry, such as that shown in FIG. 10, one or more orientation marks may be included on the carrier, such as shown at 29 in FIG. 10.

Currently, signal routing patterns having 90-degree rotational symmetry are preferred to those only having 180-degree rotational symmetry because they can be arranged with respect to neighboring chip carriers in any manner without causing a difference in the signal connectivity to neighboring chip carriers. As described below, the arrangement of power and ground pads 22, 24 has at least 180-degree symmetry for those carriers 20 which have signal routing patterns with 180-degree rotational symmetry, and may have 90-degree rotational symmetry. The arrangement of power and ground pads 22 and 24 preferably has 90-degree rotational symmetry for carriers 20 with signal routing patterns having 90-degree rotational symmetry.

The 90-degree rotational symmetry may be more fully described as follows. The signal pads in the outer (outside) array 24 may be divided into four sets of pads, with each set being disposed at a respective edge of carrier 20 and having a common pad arrangement with the other sets. In a similar manner, the signal pads disposed in the inner (inside) array 22 may be divided into four groups, each group being coupled to a respective outside set of pads 24 through a respective set of electrical traces. The four sets of inside signal pads of the inner array 22 are arranged in a first pattern that has 90-degree rotational symmetry about the center point of the inner array 22. (In the embodiment shown in FIG. 8, the center point is at the blank pad in the center of the array, which may be power or ground). More specifically, each set of inside pads has an arrangement pattern of its own pads, and the arrangement pattern of each set would coincided with the arrangement pattern of another set if it were rotated by 90-degrees about the center point. Each set of electrical traces provides a connectivity between its associated sets of inside and outside pads, and provides the same connectivity between its associated inside and outside pads as another set of electrical traces if the set of electrical traces and associated inside and outside pads were rotated by 90-degree.

Figure 9:
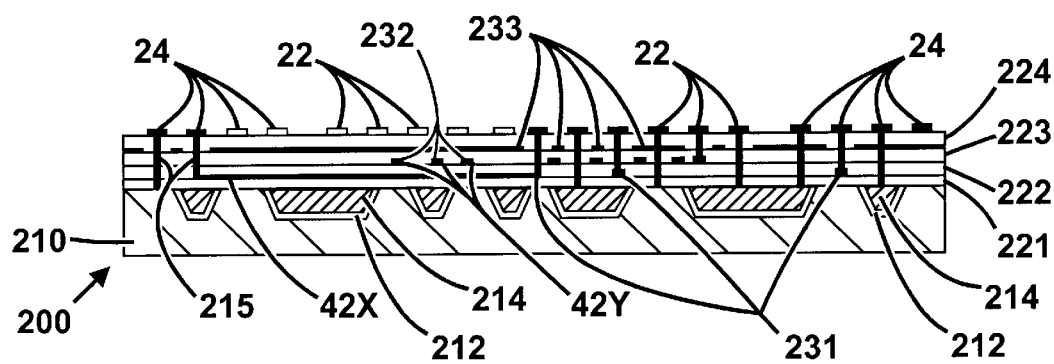
FIG. 9 is a cross-sectional view of an exemplary carrier having the set of wiring traces and signal routing pattern shown in FIG. 8 according to the present invention.

An exemplary implementation of a carrier 20 with the signal routing pattern of FIG. 8 is shown at 200 in FIG. 9, which shows a cross-sectional view of the carrier along the plane defined in FIG. 8. Carrier 200 comprises a conductive substrate 210 which conveys the ground potential from ground port 27, and a conductive grid 214 which conveys the power potential from power port 28. Grid 214 is embedded into substrate 210 and separated by a dielectric layer 212. Substrate 210 comprises a pattern of grooves which corresponds to the pattern of power grid 214. The top of grid 214 is substantially flush with that of substrate 210. Carrier 200 further comprises four dielectric layers 221–224 disposed on top of one another, with layer 221 being disposed on top of substrate 210. A first conductive layer 231 is interposed between the first two dielectric layers 221 and 222, a second conductive layer 232 is interposed between the second and third dielectric layers 222 and 223, and a third conductive layer 233 is interposed between the third and fourth dielectric layers 223 and 224. The first conductive layer 231 is patterned to comprise the "X"-signal traces. The second conductive layer 232 is patterned to comprise the "Y"-signal traces. The third conductive layer 233 is patterned to comprise an AC ground plane. Substrate 210 and power grid 214 collectively comprise a second AC ground plane. The "X"-signal and "Y"-signal traces are thereby interposed between two AC ground planes, with the bottom ground plane providing power distribution.

Inner pads 22 and outer pads 24 are disposed on top of fourth dielectric layer 224, and corresponding vias 215 couple the signal pads to corresponding traces 42, couple the power pads to power grid 214, and couple the ground pads to substrate 210. Two of the pads 24 and five of the pads 22 in the left portion of FIG. 9 are not strictly in the cross-sectional plane 9—9 defined in FIG. 8 and are shown in blank fill for reference purposes. Appropriate via connections 215 exist for these pads but are not shown since they are not in the defined cross-sectional plane. One "X"-signal trace 42X is shown in its entirety at the left side of FIG. 7, and the ends of another "X"-signal trace are shown at the right side, at the two right-most indicators of reference number 231. The cross-sections of eight "Y"-signal traces 42Y in a second conductive layer 232 are also shown in FIG. 9.

Figure 11:
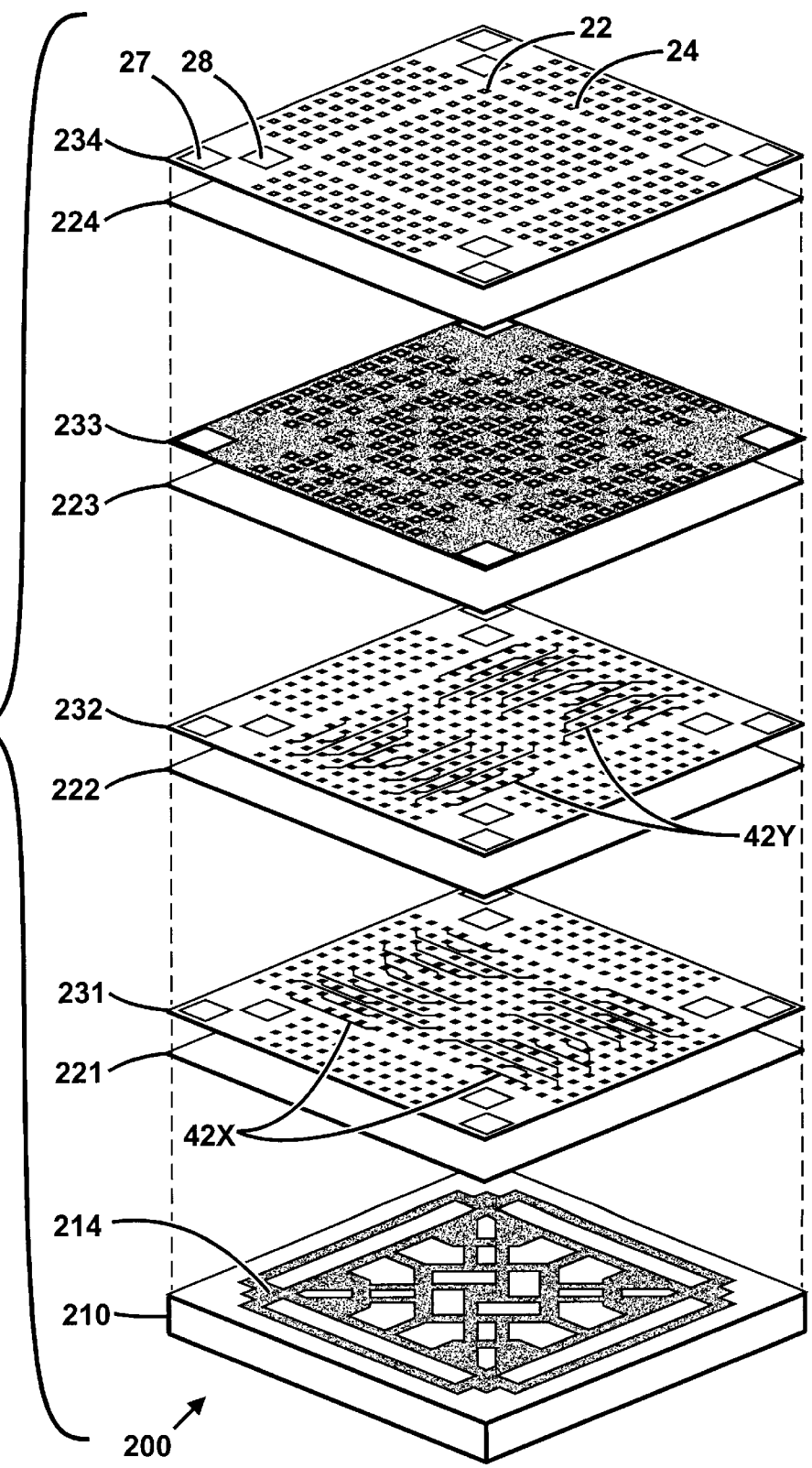
FIG. 11 is an expanded perspective view of exemplary layers of the exemplary carrier shown in FIGS. 8 and 9 according to the present invention.

FIG. 11 shows an expanded perspective view of the various layers of carrier 200. The depiction of dielectric layers 221–224 is general and does not show vias 215 for visual simplicity. The location of vias 215 in these layers will be apparent to those of ordinary skill in the art from the cross-section shown in FIG. 9 and the description thereof.

Figure 12:
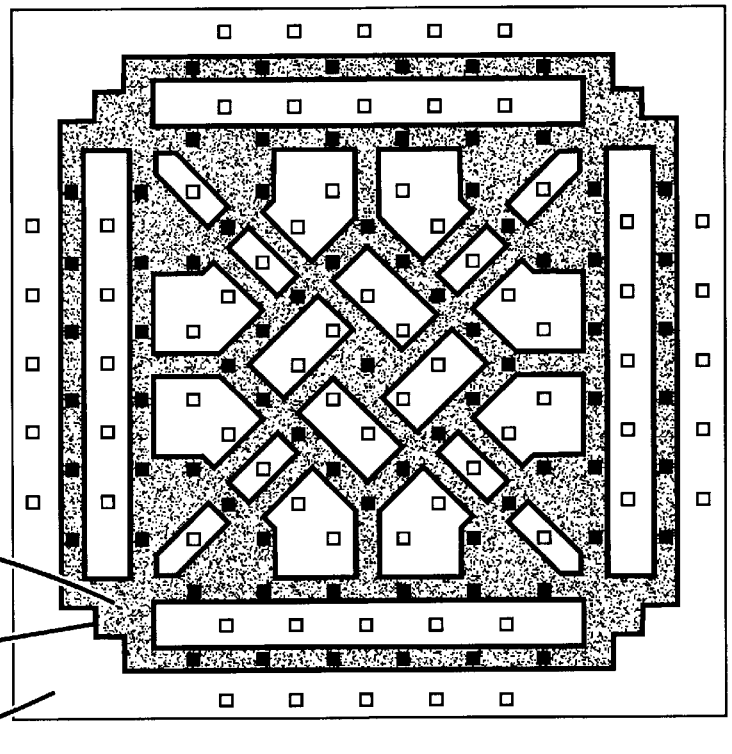
FIGS. 12 and 13 are top plan views of respective selected layers of the layers shown in FIG. 11 according to the present invention.

A top plan view of substrate 210 and power grid 214 is shown in FIG. 12, along with the locations of power and ground pads 22 and 24 superimposed thereover. The power pads are shown by dark squares, and overlie grid 214; the ground pads are shown by blank (white) pads, and overlie substrate 212. Dielectric layer 212, which is disposed between power grid 214 and substrate 210, is shown as the dark line between the shaded area of grid 214 and the unshaded area of substrate 210.

Figure 13:
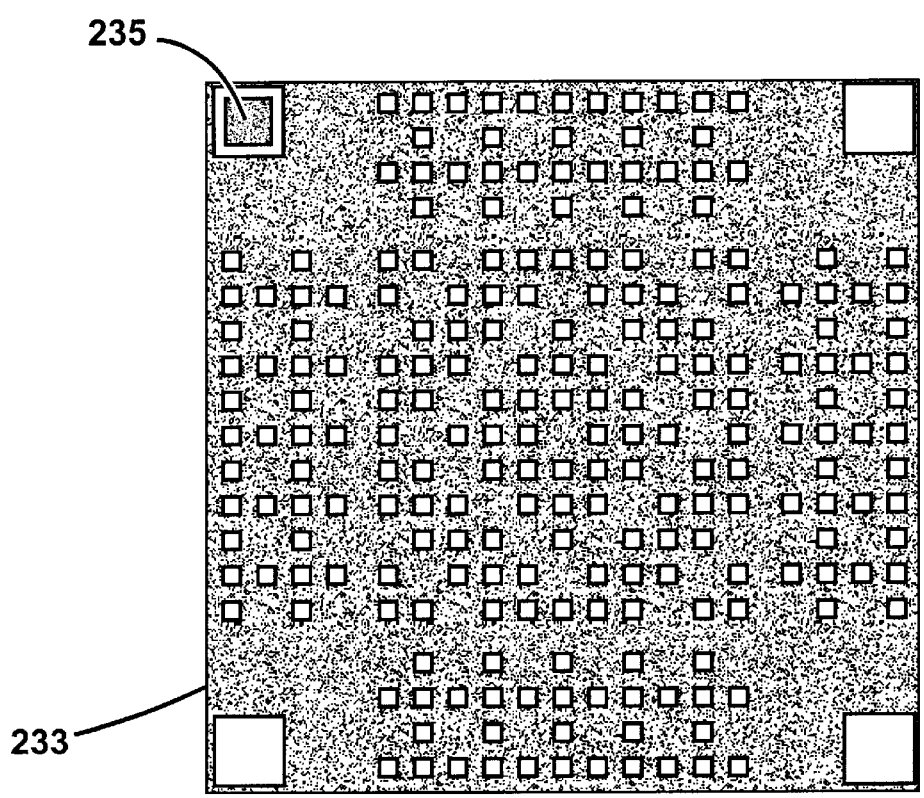

A top plan view of third conductive layer 233, which provides an AC-ground plane, is shown in FIG. 13. The shaded area is conductive, and the unshaded squares are voids (or apertures) through conductive layer 233. The voids correspond to locations of signal pads and ground pads, and vias are formed in the voids. As in many common via formation methods, each void may have a smaller metal pad within it, as shown at 235 with one of the larger voids. For visual clarity in the drawings, such smaller metal vias are not shown in all of the voids of layer 233.

For completeness, FIG. 8 shows a superimposition of the top plan views of conductive layers 231 and 232 (the "X"- and "Y"-signal traces).

Figure 14:
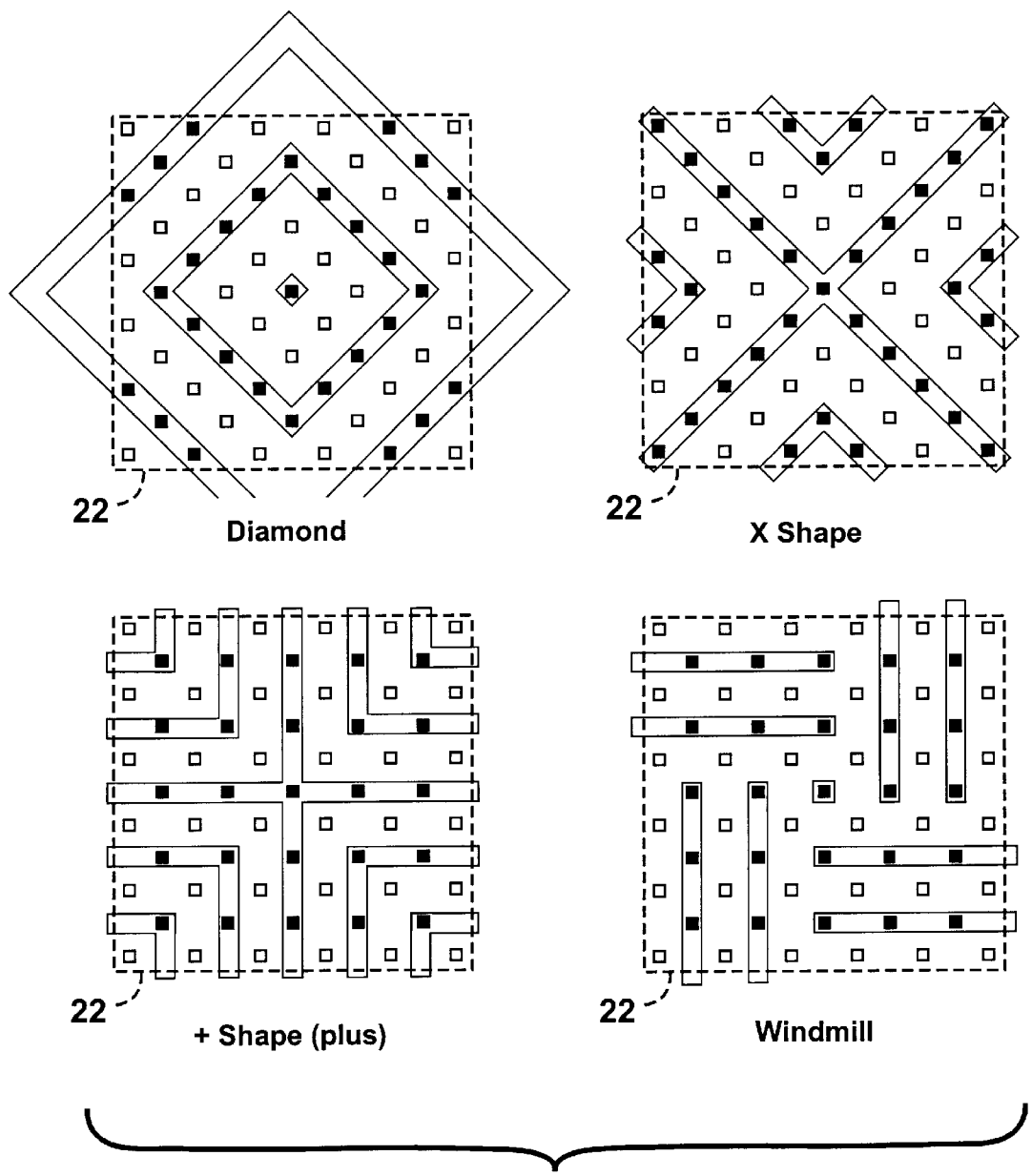
FIG. 14 is a top plan view of four exemplary symmetric arrangements of power and ground pad according to the present invention.

Referring to FIG. 12, the power and ground pads within the inner array of pads 22 may be arranged in a number of different useful patterns. The pattern shown in FIG. 12 is a diamond pattern, and is more particularly shown in FIG. 14, which shows four useful patterns: Diamond, "X"-shape, "+"-shape, and Windmill. In each of the shown patterns, the power pads are shown by black squares and the ground pads are shown by white squares. Lines are drawn around the power pads to emphasis the pattern and to show its extension to larger pad arrays. An 1-by-1 pad array is shown in the examples of FIG. 14, for a total of 121 pads, 60 of which are signal pads (which are not shown in FIG. 14 for clarity) and 61 of which are power and ground pads. The patterns shown in FIG. 14 are for an odd number of pads on a side (N), e.g. 11, 13, 15, 17, etc., and with the power/ground pad array having a pad at the center of the chip. Each of these patterns maintains the number of power pads roughly equal to the number of ground pads as the array size (N-by-N) increases. For the diamond shape, the number of power pads is less than the number of ground pads, but not by more than 3 for any size. For the "X"-shape pattern, the number of power pads is greater than the number of ground pads, but not by more than 5. The "X"-shape pattern could be modified to make the center power pad a ground pad, in which case the number of power pads is not greater than ground pads by more than 3, as in the diamond pattern. For an odd number of pads on a side (odd N), the "+"-shape pattern and the windmill pattern identify the same power pads and the same ground pads. In each of these patterns for odd N, there are more ground pads than power pads by a factor of (2N-1), which is significant for N less than 20, but relatively insignificant for N greater than 20.

From the above, it can be seen that the set of power pads has 90-degrees rotational symmetry about the center point and are evenly distributed over the area of inside array 22. This leads to 10% to 25% of the power pads being located closer to the center point of the inner array 22 than the perimeter of the inner array 22. The same may be said of the set of ground pads. Of course, each set of power pads and ground pads has 180 degrees rotational symmetry because each has 90 degrees rotational symmetry.

Of course, the designations (and therefore positions) of the power and ground pads in these patterns may be reversed. In such a case, the ground pads would be shown by the black squares (rather than the white squares) and the power pads would be shown white squares.

Figure 15:
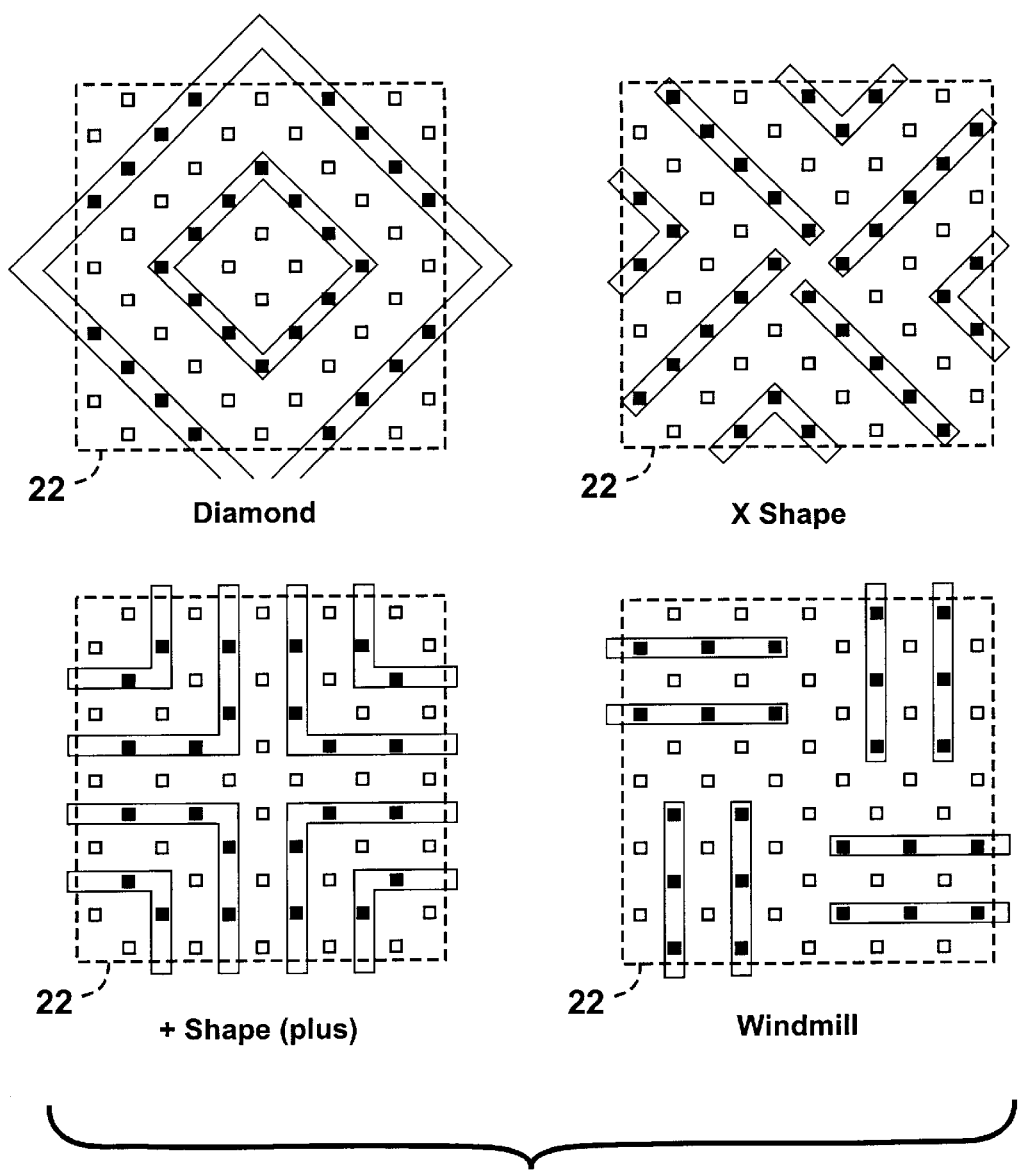
FIG. 15 is a top plan view of four additional exemplary symmetric arrangements of power and ground pads according to the present invention.

FIG. 15 shows the same patterns again for an odd number of pads on a side (N), but with the power/ground pad array being off-center instead of having a power or ground pad at the center of the chip (as is shown in the patterns of FIG. 14). In the patterns of FIG. 15, the signal pad array is in the "on-center" position with one of its pads being at the center of the chip. Like the examples shown in FIG. 14, the designations (and therefore positions) of the power and ground pads in these patterns may be reversed, with the ground pads being shown by the black squares and the power pads being shown by white squares. All of the exemplary patterns shown in FIGS. 14 and 15 for odd N have both 180-degree and 90-degree rotational symmetry.

Figure 16:
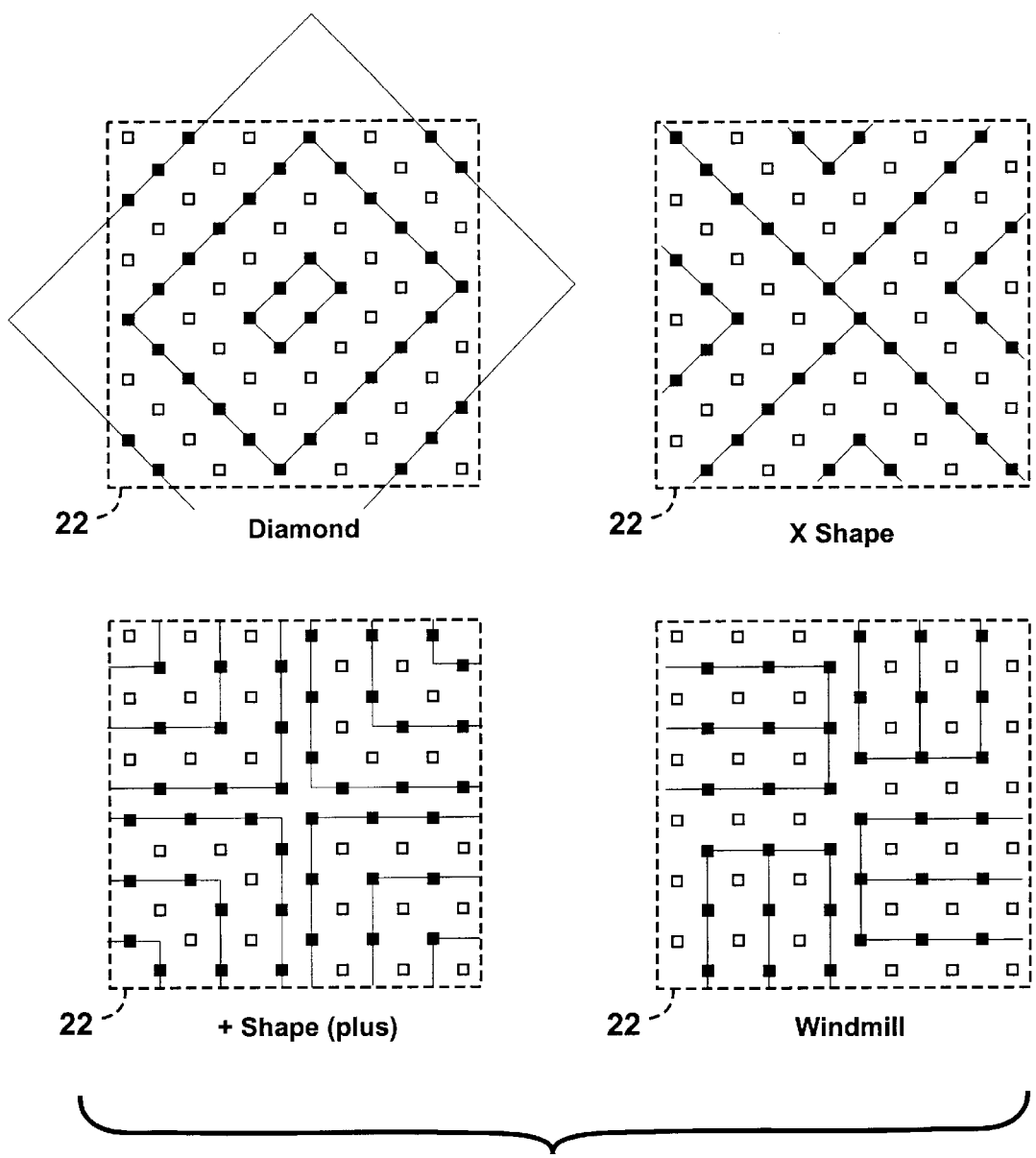
FIG. 16 is a top plan view of four additional exemplary symmetric arrangements of power and ground pads according to the present invention.

For even N, it is only possible to achieve 180-degree rotational symmetry when using a strict "checkerboard" arrangement between the signal lines and the power and ground lines. A checkerboard looks the same to each game player, and therefore has 180-degree rotational symmetry. However, the checkerboard will look different when the board is turned by 90-degrees. Nonetheless, the power and ground pads may be arranged in the diamond, "X"-shape, "+"-shape, and windmill patterns, as shown in FIG. 16. The patterns are somewhat skewed from their corresponding implementations in FIGS. 14 and 15.

Figure 17:
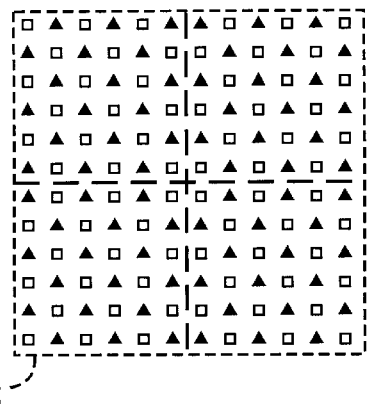
FIG. 17 is a top plan view of second exemplary allocation of signal pads, power pads, and ground pads according to the present invention.
Figure 18:
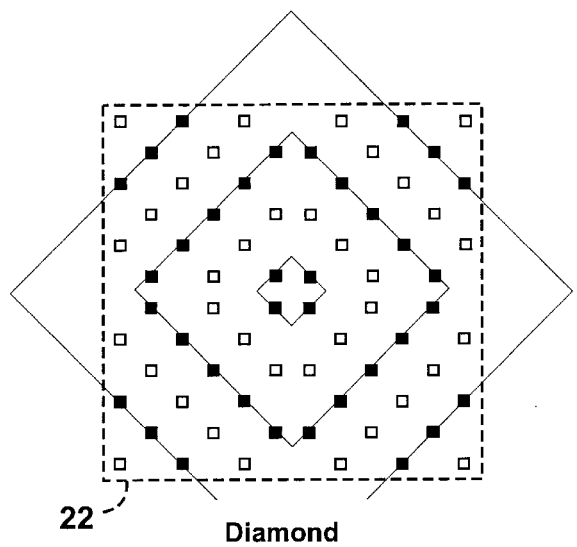
FIG. 18 is a top plan view of four exemplary symmetric arrangements of power and ground pads using the allocation of FIG. 17 according to the present invention.
Figure 18:
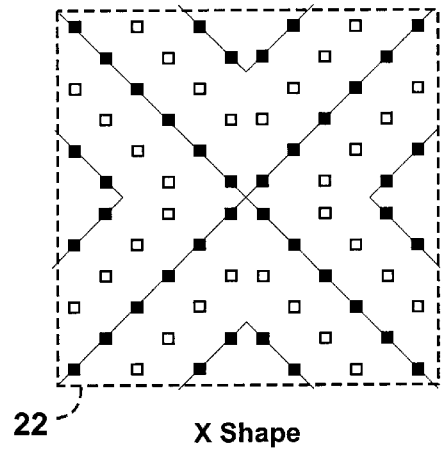
Figure 18:
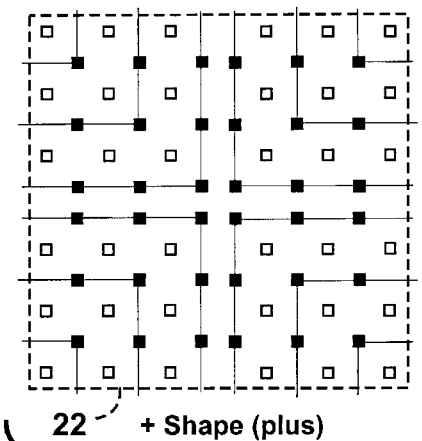
Figure 18:
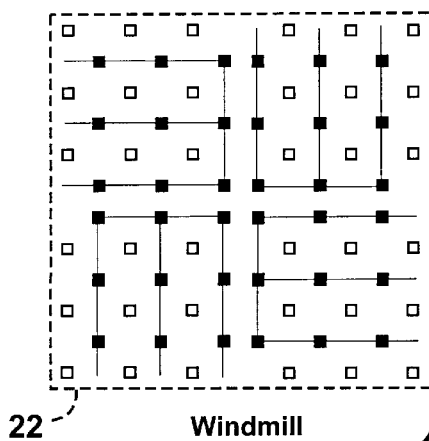

90-degree rotational symmetry can be achieved for even N if a modified checkerboard pattern is used, as shown in FIG. 17. In this pattern, signal pads are shown by black triangles, and power and ground pads are shown by white squares. The array is evenly divided into four quadrants, each quadrant strictly adhering to the checkerboard pattern. However, the quadrants are arranged to have 90-degrees rotational symmetry. The pattern shown in FIG. 17 may be readily obtained by laying out the checkerboard pattern (i.e, red-black ordering) in one of the quadrants, copying the image of the quadrant and then sequentially rotating the copy by 90-degrees to derive the patterns in the remaining three quadrants. FIG. 18 shows the four basic patterns using the modified checkerboard pattern. Power pads are shown by black squares and the ground pad are shown by white squares. As with the previous patterns, the relative positions of the power and ground pads in these patterns may be reversed, which would result in pattern images which are the negative of those shown in FIG. 18.

Figure 19:
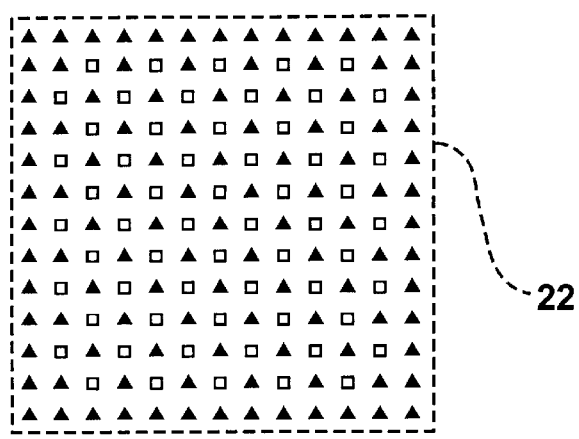
FIG. 19 is a top plan view of third exemplary allocation of signal pads, power pads, and ground pads according to the present invention.

In each of the above patterns, the outermost square of pads in inner array 22 may be assigned to signal lines in order to increase the number of total signal pads. Such a pattern is shown in FIG. 19 (same drawing sheet as FIG. 10). The signal pads are shown by black triangles, and the power and ground pads are shown by white squares.

Chip Layout and Signal Routing Methods

Figure 20:
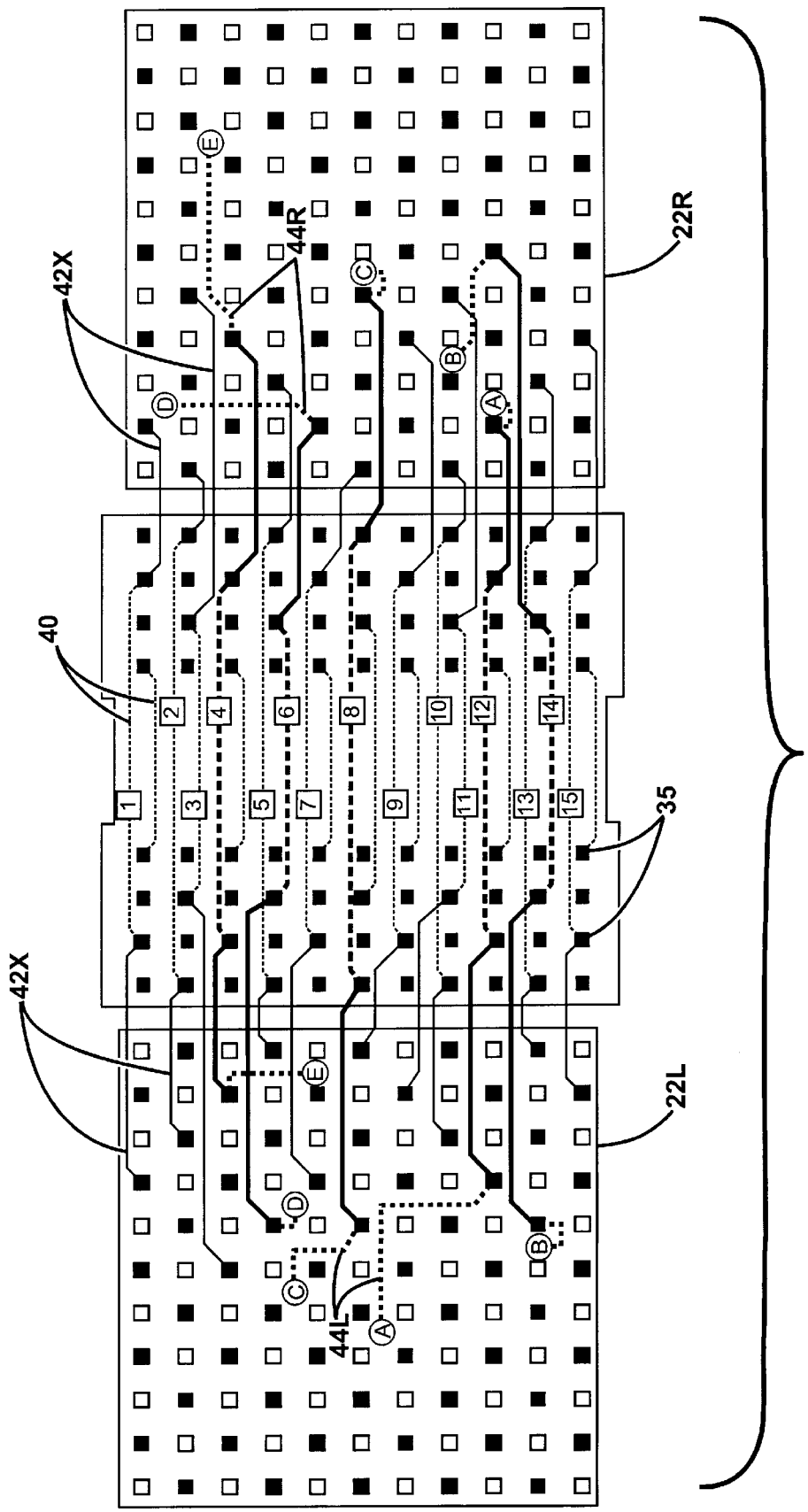
FIG. 20 is a top plan view of the inner pad arrays of two exemplary universal chip carriers and an exemplary bridge connector showing the formation of interconnect traces between the chip carriers according to the present invention.

When a bridge connector 30 is connected between two carriers 20, a relatively large number of available signal lines are formed between the two carriers. The number of available signal lines is much larger than the actual number of signals that are to be conveyed between the two carriers 20. The available signal lines are illustrated in FIG. 20, which shows a top plan view of the inner pad arrays of two universal chip carriers 20L and 20R (from the implementation shown in FIG. 8), the traces of a bridge connector 30 (shown in dashed lines), and the internal traces 42X in the carriers which connect the signal pads to the signal pads of the bridge connector. Signal pads are shown by solid-fill (black) pads, and power and ground pads are shown by blank-fill (white) pads. A chip 5L is to be attached to carrier 20L by flip-chip bonding and a chip 5R is to be attached to carrier 20R. The traces 42X on the carriers 20L,20R and the traces 40 on connector 30 collectively comprise fifteen available (15) signal lines between the two carriers, which are labeled in FIG. 20 with numbers #1–#15, each number appearing in a square by its corresponding trace. (Bridge connector 30 comprises 22 traces, only 15 of which are used by carriers 20 in this exemplary implementation of the present invention.). Traces connecting to the other sides of the carriers have been omitted from FIG. 20 for clarity.

In typical constructed embodiments of the present invention, the number of available signal lines between the two carriers may be between 150 and 2,000, or more, whereas the total number of signals to be conveyed between the two carriers is between 50 to 500. A small number of available signal lines is shown in FIG. 20 for visual clarity, with it being apparent to one of ordinary skill in the art how the number may be increased to any desired amount in view of the teachings of the present specification.

The provision of available signal lines #1–#15 will be the same between any two chip carriers 20, provided that trace routing patterns of carriers 20 are the same, and that the routing patterns of the bridge connectors are the same, and thus a regular and symmetrical network of available signal lines are formed among the chip carriers 20. However, rarely if ever, is the signal pattern of an electronic system regular and symmetrical. Accordingly, the network of signal lines provided by the present invention is contrary to conventional practice where irregular trace patterns are formed on the various levels of chip packaging to match the irregular signal pattern of the electronic system. The chips of such irregular electronic systems can be substantially different from one another, apart from sometimes sharing some common clock distribution circuitry. The present invention can readily place several different chips in close proximity to one another, with each of these chips having no more than 10% of their circuitry of a common design (i.e. identical design and function).

To implement the irregular and non-symmetrical signal pattern of a typical electronic system in the regular signal networks of the present invention, the following general steps are taken. First, a subset of the available signal lines #1–#15 between two chip carriers is selected to convey the actual number of signals between the chip carriers 20. Typically, less than one-third of the available signal lines are selected for use, meaning that the carriers 20 provide three-times or more of the number of signal lines that would typically be required by the electronic system. As the general second step, the top metalization layers of the IC chips, which contains the interconnect pads, are modified from their normal configurations to move the signal pads of the IC chips to locations where they can mate with the pads on the carriers 20 that are connected to the selected subset of available signal lines. In the modification, each signal exits or enters from the top surface of the chip at its usual location, and is then routed over to the modified pad location by a modification trace. Output signals "exit" the chip, whereas input signals "enter" the chip (clock signals are considered to be input signals). The exit point of an output signal is usually close to, or at, the point where the signal is generated by the chip's active components, and the entry point of an input signal is usually close to, or at, the point where the signal is received as an input by the chip's active circuitry. In general, each signal trace #1–#15 of the selected subset receives an output signal at one of its ends from one of the chips, and provides that signal as an input at its other end to the second chip.

In general, the subset of available signal lines is selected to minimize the amount of pad movement and the lengths of the modification traces, which in turn minimizes the chance that two or more modification traces would intersect. For simple to moderately-complex systems, the modification can usually be carried out in the top metalization layer without modification traces intersecting one another. More complex systems may require modifications to two levels of metalization in some of the chips, such as to implement cross-overs between modification traces. The concept of modifying the top metalization layers of the IC chips to match the provisions of the interconnect system (e.g., carriers 20) runs contrary to conventional thinking and practice, which holds that modifying the IC chips is an expensive proposition and is to be avoided.

Figure 21:
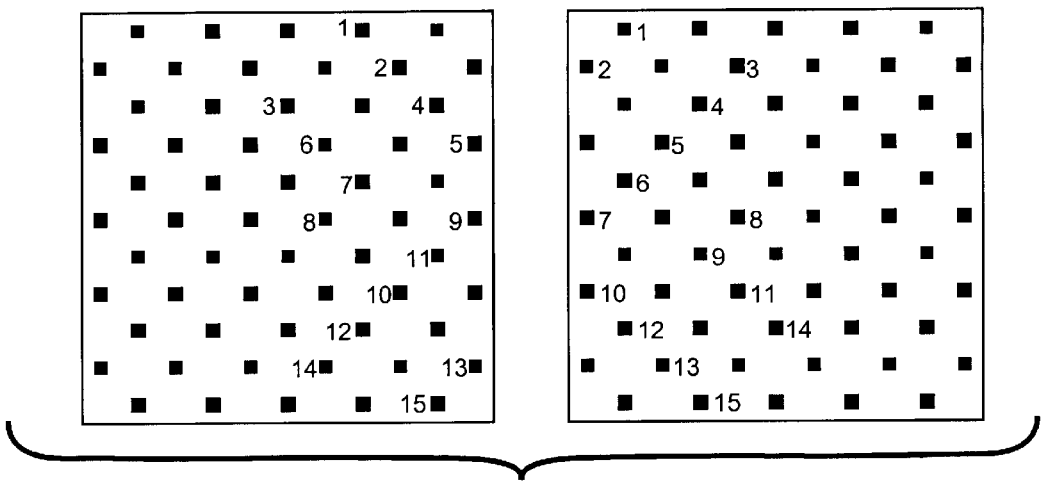
FIG. 21 is a top plan view of the inner pad arrays of two adjacent chip carriers of FIG. 20 showing the location of the ends of the traces formed between the two carriers according to the present invention.

An exemplary process of configuring of the present invention to implement the signal interconnection for an irregular, non-symmetrical electronic system is illustrated by way of FIG. 20. The exit/entry locations of five signals "A"–"E" from the top surface of chip 5L are shown in the figure by the corresponding designations "A"–"E" in circles. These signals are to be routed to five corresponding locations on chip 5R by way of the traces 42X of each carrier and the traces 40 of bridge interconnector 30. The exit/entry points of the five signals on the top surface of chip 5R are also shown by the corresponding designations "A"–"E" in circles. Since these chips are preferably flip-chip attached to their respective carriers, the locations of signals "A"–"E" are shown as if one were viewing through the chips from the back surface, with the chips attached to the carriers. Signal "A" is routed through signal line #12, signal "B" is routed through signal line #14, signal "C" is routed through signal line #8, signal "D" is routed through signal line #6, and signal "E" is routed through signal line #4. Signals lines #4, #6, #8, #12 and #14 are shown with heavier line widths in order to more clearly distinguish them over the signal lines which are not used. Modification traces 44L and 44R are formed in a metalization layer (preferably the last such layer) of each of chips 5L and 5R, respectively, and route each of the signals "A"–"E" from their exit points on the chip surface to a signal pad on the IC chip which connects to an appropriate signal line (i.e., lines #4, #6, #8, #12 and #14). On-chip traces 44L and 44R are shown by dashed lines in FIG. 20. For ease of reference, FIG. 21 shows the locations of the ends of traces #1–#15 on the two chips.

Not all of signal lines #1–#15 are used, and each of signals "A"–"E" may be routed through any of the signal lines #1–#15 as long as the selected line does not cross a trace for another signal in the IC chip metalization layer (if only one metalization layer is being modified). In general, signals "A"–"E" are routed on a subset of the signal lines #1–#15 which minimizes the overall length of traces 44L and 44R, and which does not cause any of the traces 44L and 44R to cross one another in the same metal layer. Such crossing in the same metal layer would cause an unintended electrical connection of two signals. Minimizing the overall length of traces 44L and 44R reduces the chances of crossing. If crossing cannot be avoided, a second layer may be customized to route one of the signals, or a second custom metal layer may be added over the last metal layer (separated by a dielectric layer except for via points).

There are a number of methods in which a subset of traces that minimizes the overall length of traces 44L and 44R may be determined, or computed. One such method is provided below. For each signal "A"–"E", the lengths of traces 44L and 44R are computed for each signal line #1–#15 using a minimum "Manhattan" routing distance (i.e., X+Y distance). These lengths are designated as $L_L$ for a trace 44L and $L_R$ for trace 44R, and the sum of these two lengths is designated as the combined length $L_C$ ($L_C = L_L + L_R$). For each signal, a given number J of signal lines which have the shortest combined length are identified, and sorted according to shortest length. As an example, the five signal lines (J=5) having the shortest combined trace length for signals "A"–"E" are given below in TABLE I, along with the combined length, which is given in relative units.

TABLE I

| Signal | Shortest Line Column 1 | Column 2 | Signal Lines $L_C = L_L + L_R$ Column 3 | Column 4 | Longest Line (J = 5) of the first 5 lines. Column 5 |
|---|---|---|---|---|---|
| "A" | Line #12 6.5 = 6.0 + 0.5 | Line #10 8.5 = 6.0 + 2.5 | Line #8 8.5 = 3.0 + 5.5 | Line #6 9.5 = 5.0 + 4.5 | Line #7 9.5 = 5.0 + 4.5 |
| "B" | Line #14 4.0 = 0.5 + 3.5 | Line #12 5.0 = 2.5 + 2.5 | Line #10 7.0 = 4.5 + 2.5 | Line #13 7.0 = 4.5 + 2.5 | Line #8 8.0 = 4.5 + 3.5 |
| "C" | Line #8 3.5 = 3.0 + 0.5 | Line #3 6.5 = 2.0 + 4.5 | Line #6 6.5 = 2.0 + 4.5 | Line #7 7.5 = 3.0 + 4.5 | Line #9 9.5= 7.0 + 2.5 |
| "D" | Line #6 5.0 = 1.0 + 4.0 | Line #1 5.0 = 4.0 + 1.0 | Line #3 6.0 = 3.0 + 3.0 | Line #2 6.0 = 4.0 + 2.0 | Line #4 7.0 = 4.0 + 3.0 |
| "E" | Line #4 7.5 = 2.5 + 5.0 | Line #5 8.5 = 1.5 + 7.0 | Line #3 10.5 = 6.0 + 4.5 | Line #9 10.5 = 1.5 + 9.0 | Line #8 11.5 = 4.5 + 7.0 |

The set of lines which has the lowest total trace length appears in Column 1, as long as there are no duplicate line indications in the column. The total trace length $L_T$ for a set of signal lines is defined as the sum of corresponding combined lengths $L_C$ in the set. Column 1 of TABLE I does not have any duplicates, and has a total trace length $L_T$ of 26.5 relative units. The total trace length for Column 2 is 33.5 relative units, and 45.5 relative units for Column 5. (For comparison, the set that maximizes the amount of trace length had a total trace length of 93 relative units.)

If there were a duplicate entry in Column 1 (i.e., a single signal line being the shortest for two of the signals "A"–"E"), then one of the duplicate entries would be replaced by the entry in the next column to the right (but same row) which was not already listed in Column 1. Either of the duplicates can be replaced, and one will probably give a lower total than the other. As an example, Column 3 has Line #3 duplicated for signals "D" and "E". Assuming only for the sake of illustration that Columns 1 and 2 did not exist and that the selection process started with Column 3, then the duplicate for signal "D" could be replaced by Line #2 from Column 4, or the duplicate for signal "E" could be replaced by Line #9 from Column 4. Using Line #2 as the replacement would give the lower total trace length (by 4.5 relative units: 4.5=10.5 −6.0). A final column, Column 0, may be added to the Table to hold the final selection which reflects the selections from Column 1 and the replacement of any duplicate entries.

Clearly, the number J of columns computed should be chosen to be equal to the highest expected number of duplicate entries in Column 1. As a conservative step, J can be set equal to the number of signals, which would be the maximum possible number of duplicates.

Once a set of signal lines is chosen, a conventional trace routing program can be employed to determine a precise layout for the traces 44L and 44R on chips 5L and 5R, respectively. The routing program may, of course, perform the routing for one set of signals, or for all the signal sets of the chip, which is generally up to four sets since each chip has up to four adjacent neighboring chips.

The information in TABLE I not only provides substitute signal lines for duplicate column entries, but also provides a list of ranked alternative routing selections for a signal in case the routing program encounters a routing conflict with another signal line. Providing alternative selections makes it easier to resolve such conflicts.

It is possible that the set of selected signal lines (i.e., Column 0) will have significantly more of the total trace length $L_T$ on one of the two chips, making it more difficult for the routing program to route signals on that chip, which will be referred to as the "dense" chip. This may be expressed mathematically as $EL_L >> EL_R$ or $EL_L << EL_R$, where the summations are taken over the signals in Column 0. If there is a large imbalance, for example the dense chip having more than 75% of the total trace length, then Column 2 may be examined for alternative choices that would reduce the percentage toward 50%. The use of the alternative choices would tend to increase $L_T$. However, in typical implementations of carrier 20, the number of signal lines between two adjacent chips is above 100, and in many implementations above 400, which causes the average difference in trace length $L_C$ between Column 1 entries and the corresponding Column 5 entries to be relatively small. Accordingly, in typical systems, the increase in $L_T$ caused by using alternative choices is small. Columns 2 through 5 (or more) may be scanned for alternative choices which would lower the overall trace length on the dense chip. Those alternative choices which lower the trace length the most on the dense chip with the least increase in $L_T$ may be chosen. If an alternative choice already appears in Column 0 as being used for another signal, it may not be considered at all, or it may be considered with the provision that a replacement signal line is chosen for the conflicting signal, so that there are no duplicates. The replacement signal should be one that does not increase the imbalance.

In the exemplary wiring pattern for carrier 20 shown in FIGS. 8 and 20, the signal traces 42X going to an adjacent chip extend only into one half of the IC chip area. If there are several signals outside of this area, such as for signal E for chip 5R, it may not be possible for the router to successfully route on-chip traces for all the signals using just one custom metal layer on the IC chips, particularly if three or more of the adjacent chips require such extensive on-chip traces. This problem is easily addressed by using a second custom metal layer on the IC chips. The problem may also be addressed by using a different wiring pattern in carrier 20 which distributes the terminating ends of the signal traces 42X over both halves of the IC chip. As yet another approach, in those cases where the chips in the system have not yet been laid-out and fabricated, the chip layouts may be done to provide a more favorable match of the signal origins to the ends of the selected traces.

Having described various methods for routing signals between two adjacent chips by customizing one or more metalization layers on each chip, a general method for arranging the chips of a system with respect to one another is now described.

Step #1. The number of signals coupled between each chip and the other chips is counted. For N chips, there will be N(N−1)/2 counts. The counts are generically notated as $SC_{X,Y}$, where X is the $X^{th}$ chip and Y is the $Y^{th}$ chip. Each count $SC_{X,Y}$ is associated with two chips X and Y, with $SC_{X,Y}$ being the same as $SC_{Y,X}$. For example, a four chip system has six signal counts: $SC_{1,2}$, $SC_{1,3}$, $SC_{1,4}$, $SC_{2,3}$, $SC_{2,4}$, and $SC_{3,4}$.

Step #2: The counts $SC_{X,Y}$ are ordered (i.e., sorted) in descending order of their magnitudes.

Figure 22:
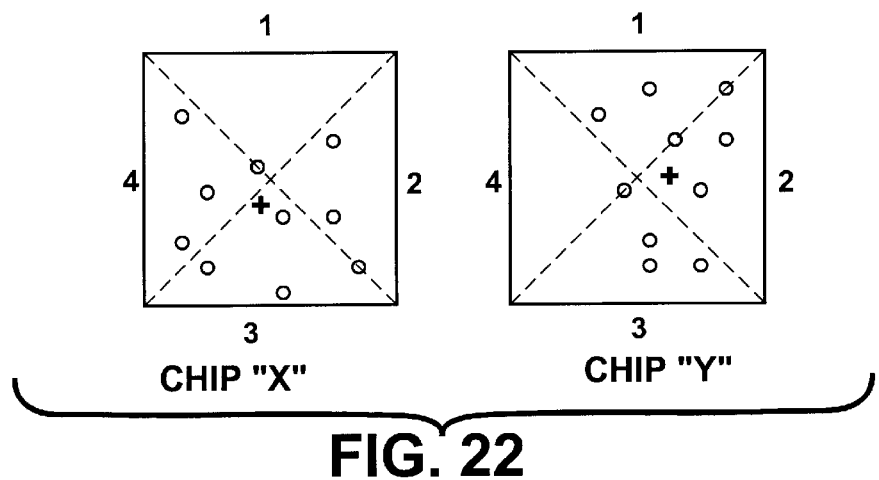
FIG. 22 is a view of two exemplary chips, as viewed from the back sides of the chips, showing the entry and exit points of the signals which run between the chips and the centroids of signal points according to the present invention.

Step #3: For each of the two chips X and Y associated with a count $SC_{X,Y}$, the entry and exit points on the X and Y chips of the signals in the count are determined. For example, the entry and exit points of the signals A through E are shown in FIG. 20 by the small circles. FIG. 22 shows two exemplary chips X and Y with the entry and exit points of the signals which run between the chips shown in circles. (The locations are shown as if one were viewing through the chips from the back surface, with the chips being flip-chip attached to the carriers.) For typical IC chips, the entry and exit points are in the metal and/or poly layers immediately below the pad metalization layer.

Step #4: The two chips associated with the highest chip-to-chip signal count SC are allocated to be in adjacent chip carriers. These first two chips are the beginning of a first chip cluster to which additional chips will be added at the remaining available chip sides. There are sixteen different ways in which the first two chips may be oriented with respect to each other. As one general approach of deciding the orientation of the two chips, the total combined trace length for each possible orientation may be computed, as described above, and the orientation providing the lowest combined trace length may be chosen. With the two chips arranged with the orientation providing lowest combined trace length, the chips' sides which face one another are designated as the interface sides.

Figure 23:
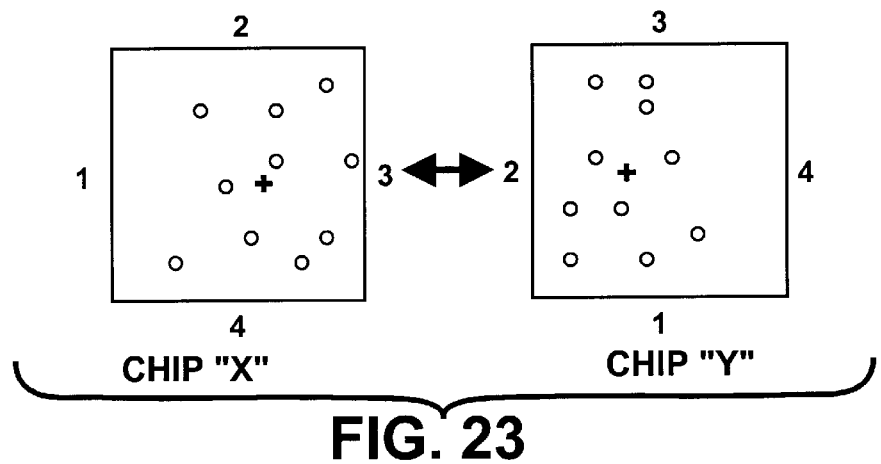
FIG. 23 is a view of the two chips of FIG. 22 after being rearranged to bring their signal centroids close together according to the present invention.

As a second approach for deciding the chips' orientation, which is less general but easier to compute, the side of each chip X and Y which is closest to the bulk of its signal locations for the count $SC_{X,Y}$ is determined and labeled as the "interface" side for the count. The determination may be done by visual inspection in most cases, and can always be done by computing the center of gravity of the entry and exit points and then finding the side closest to the center of gravity. A center of gravity computation may be done by assigning the origin of a Cartesian plane at the center of the chip, determining the X and Y value of each location, and then computing the average X value and average Y value. The side which is closest to one of these two average values is the interface side. In FIG. 22, the center of gravity has been indicated with a plus "+" sign on each chip, and the four sides of each chip have been labeled with corresponding numbers 1–4. For chip X, the interface side is side 3, and for chip Y the interface side is side 2. (Imaginary diagonal lines may be overlaid on each chip, as shown in FIG. 22, to more easily identify the interface side from the center of gravity. The diagonal lines provide an easy computational method for a computer to determine the interface side.) The two chips may then be oriented within their respective chip carriers such that their interface sides face one another (i.e., the interface sides are the closest to one another). The orientation is schematically demonstrated in FIG. 23 where the chips in FIG. 22 have been arranged with their interface sides facing one another. This approach step is particularly useful and computationally simple when the carriers 20 have trace ends for an adjacent chip congregated near the side closest to the adjacent chip, such as the exemplary carriers shown in FIGS. 8 and 20.

Step #5: The two chips associated with the next highest count SC are then placed adjacent to one another in a similar manner as the chips from the first count in step #4. If the two chips of the second-highest count are different from those in step #4, a second chip cluster is formed, which will usually be linked to the first chip cluster by one or more of the remaining chips once all of the chips have been placed. If one of the chips of the second-highest count is the same as one of the chips placed in step #4, then the pair has only one un-placed chip which needs to be added to the first chip cluster. In this case, there is a possibility that the interface side of the previously-placed chip has already been taken in step #4, in which case the second best interface side is chosen for the previously-placed chip. Ordering the signal counts in descending order, as done in step #2 above, minimizes the possibility of the interface side being taken by a previously-placed chip.

Figure 24:
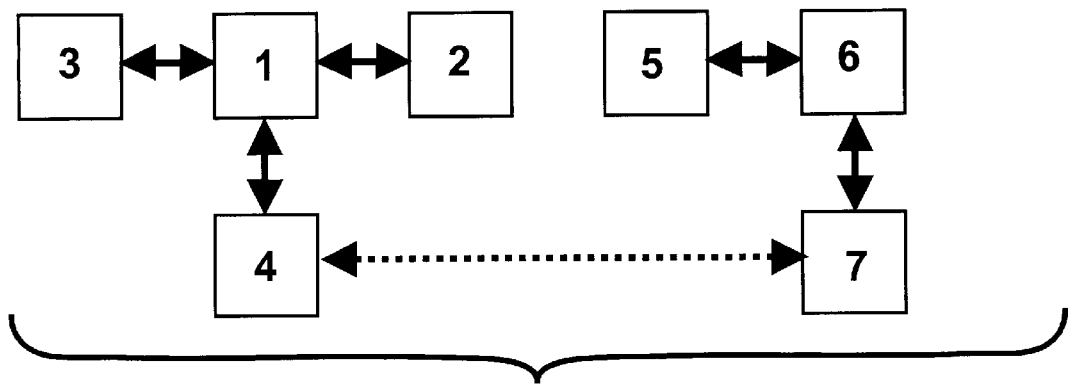
FIGS. 24–31 are top plan views of various layouts of chips showing common chip placement conflicts and resolutions to such conflicts according to the present invention.
Figure 25:
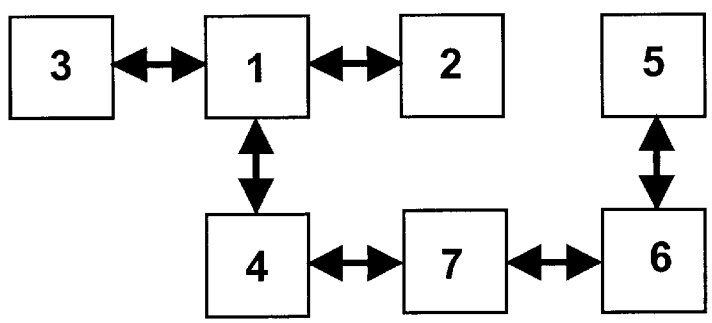
Figure 26:
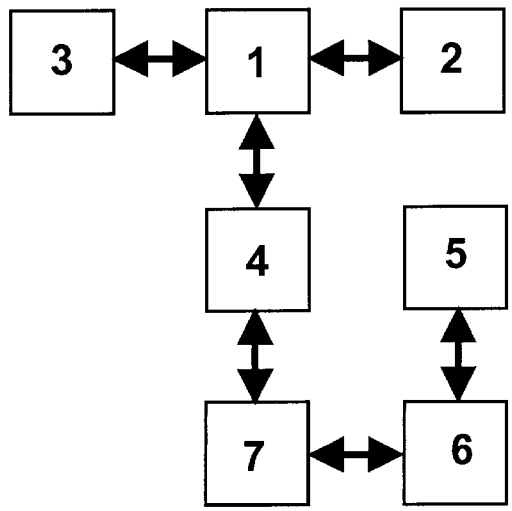

Step #6: The process of step #5 is reiterated for the remaining signal counts SC, proceeding in descending order. For the most part, this involves adding unplaced chips in one of the chip clusters. In some instances, the two chips of a given signal count SC may have already been placed in different chip clusters, in which case the two chip clusters are to be merged into one chip cluster. The two clusters are merged in a compatible way such that chips from the two clusters do not contend for the same physical location. The clusters are tentatively joined at the interface sides of the two chips at which the merger occurs, the two chips being called the "merger chips", and a check for chips from different clusters being allocated to the same physical spot is made. An example of the tentative joiner is shown in FIG. 24 where a first cluster comprises chips 1 through 4, a second cluster comprises chips 5 through 7, and where the tentative joiner between chips 4 and 7 is shown by a dashed line with arrows terminating at these chips. If there is no conflict, the method proceeds to step #7, below. If there is a conflict, another set of interface sides is chosen for the merger chip, and a conflict check is again made. In the example shown in FIG. 24, there is a conflict between chips 1 and 5, and a conflict between chips 2 and 6. There are eight available alternative sets of interface sides to choose from, two of which are shown in FIGS. 25 and 26, respectively. In FIG. 25, the original interface side for chip 4 has been maintained, while a new interface side has been selected for chip 7. In FIG. 26, the opposed selection has occurred where the original interface side for chip 7 has been maintained while a new interface side has been selected for chip 4. Usually, one of the merger chips will have a higher total number of signals coupled to it than the other, and it may be best to maintain the original interface side designation for that chip. For example, if chip 4 has more total signals coupled to it than chip 7, the configuration shown in FIG. 25 may be given preference over that shown in FIG. 26.

Figure 27:
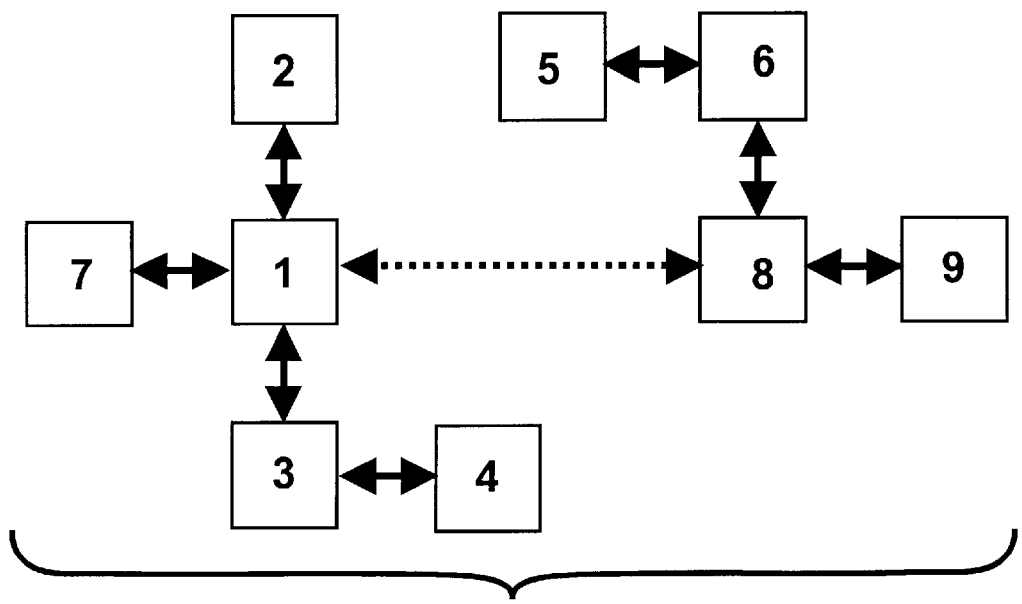
Figure 28:
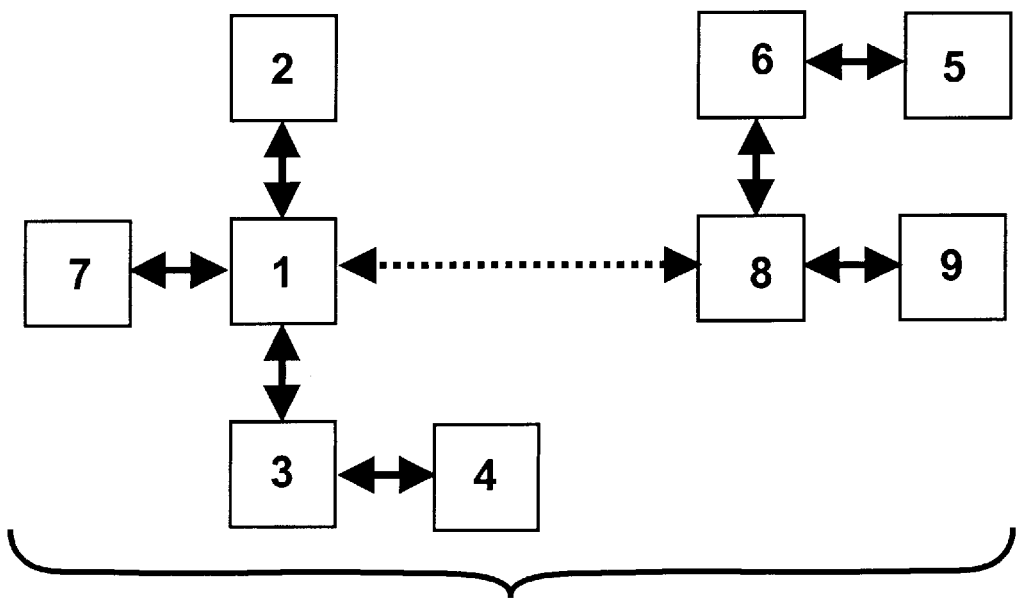

If the selection of alternative interface sides for the merger chips does not resolve a physical conflict between the two chip clusters, the previously-placed signal counts within one or both of the chip clusters may be reassigned interface sides. An example is shown in FIG. 27 where two chips clusters are to be merged at the merger chips 1 and 8. There is a physical conflict between chips 2 and 5, and there is only one alternative set of interface sides for chips 1 and 8, which is selecting the other free side of chip 8. However, this alternative set of interface sides has a conflict between chips 4 and 9. The conflict can be readily resolved by re-assigning interface sides for chips 5 and 6, which is shown in FIG. 28. Additionally, previously-placed signal counts in both chip clusters may be re-assigned in order to resolve a conflict. Moreover, re-assignment of previously-placed signal counts can be undertaken along with a re-assignment of the interface sides of the merger chips, particularly if such action is advantageous. In general, it is better to re-assign those signal counts SC which have the lowest values.

Figure 29:
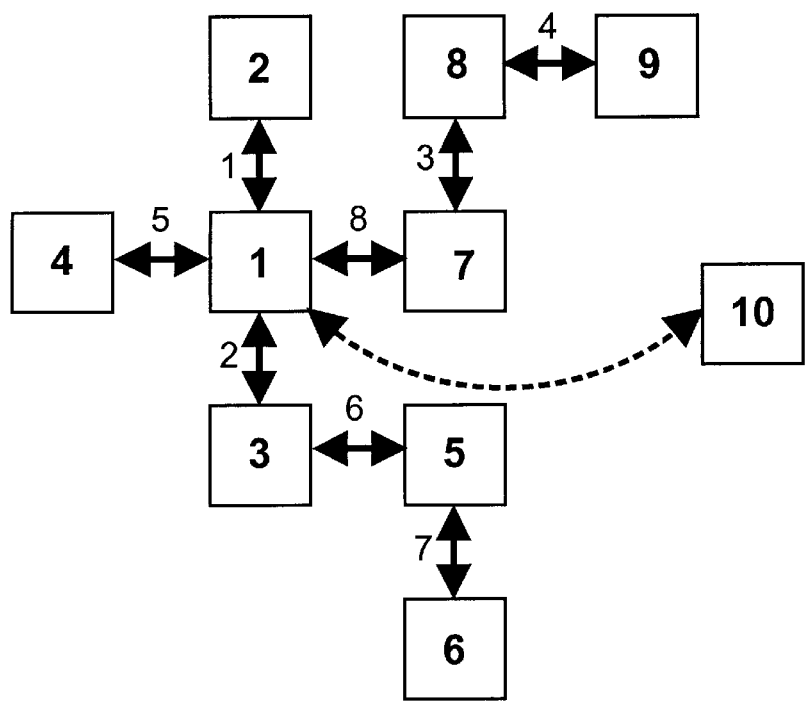
Figure 30:
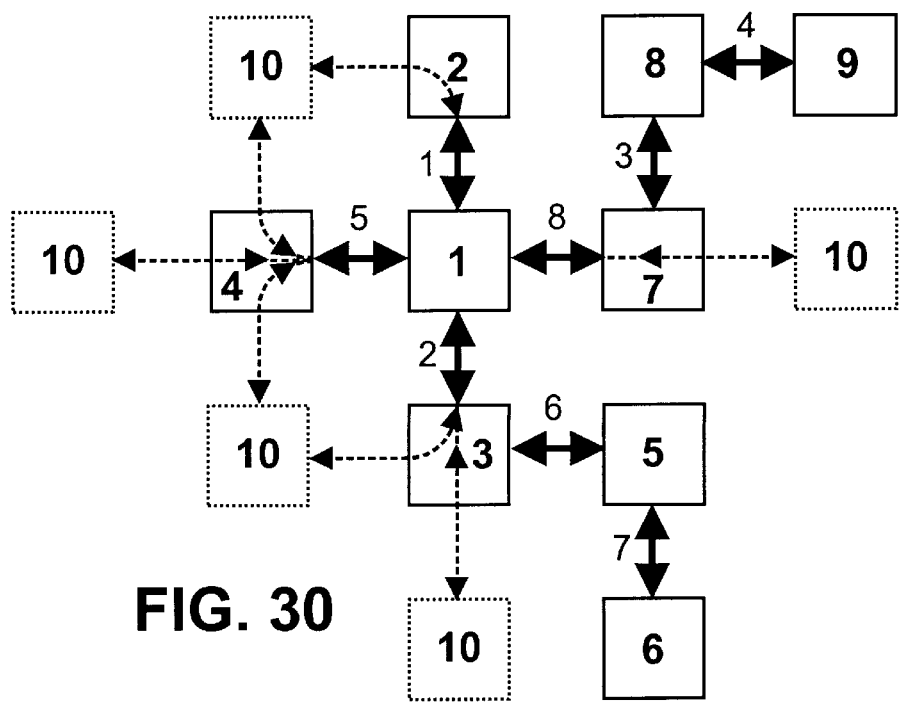

As the process of step #6 progresses further down the ranked list of SC counts, there may be instances where one of the chips already has its four closest neighbor locations allocated. An example of this is shown in FIG. 29 where chip 10 is to be placed next to chip 1, but chip 1 already has chips 2, 3, 4, and 7 allocated in the adjacent locations. In this case, the next available open location is taken, and the signals between chips 1 and 10 have to be routed through one or more of the adjacent chips 2, 3, 4, and 7. A number of possibilities for placing chip 10 and routing the signals to chip 1 are shown in FIG. 30. As the signal count $SC_{1,10}$ for chips 1 and 10 is relatively low on the ranked list of signal counts, relatively few signals will need to be routed through the adjacent chips. Preferably, the adjacent chip which has the lowest signal count with chip 1 is selected to convey the signals between chips 1 and 10 since that chip will generally pose a lower chance of routing conflicts. The details of routing these "pass-through" signals is described below under step #8 in greater detail. In FIGS. 29 and 30, the rank of the various signal counts is shown by a number designation next to the corresponding arrow link symbol; the rank designation "1" represents the highest signal count. Of all the adjacent chips to chip 1, chip 7 has the lowest signal count with chip 1, and chip 10 may be positioned next to chip 7 in the next available adjacent location. However, because additional chips may need to be placed next to chip 7, other alternatives should be identified and recorded in case a conflict should occur as the process progresses down the ranked list of signal counts. FIG. 30 shows several possible placements of chip 10, including the placement next to chip 7. Chip 4 has the next fewest signals going to chip 1 ($SC_{1,4}$), and has three available adjacent locations for chip 10. In the available location above chip 4, signals between chips 1 and 10 may be routed through chip 2 as well as through chip 4, or a combination of both. Likewise, in the available location below chip 4, signals between chips 1 and 10 may be routed through chip 3 as well as through chip 4, or a combination of both. This approach of using pass-through signals can also be used in instances where a merger of two chip clusters have a high number of chip conflicts.

Figure 31:
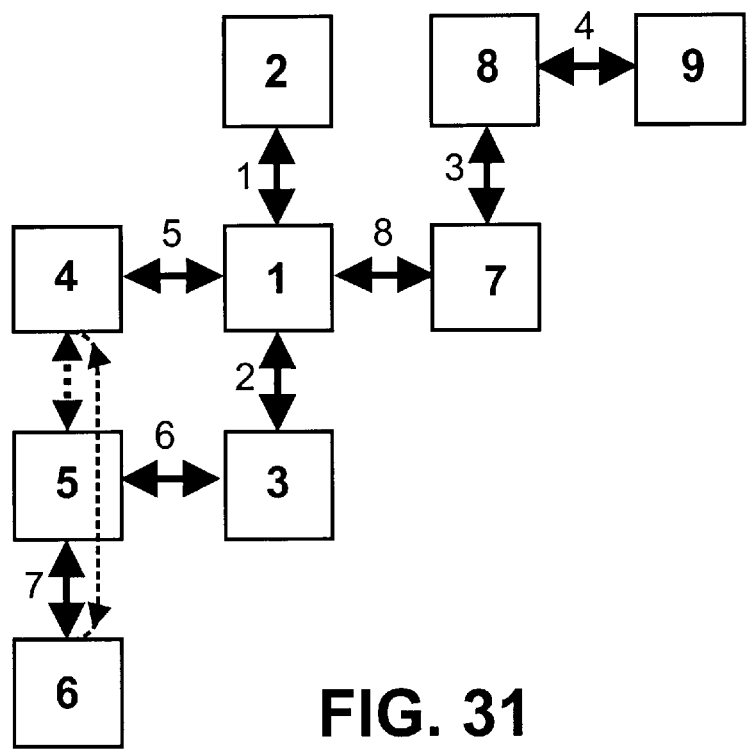

As the process for step #6 progresses further down the ranked list of SC counts, there may be instances where one of the signal counts is between two chips which have been previously placed in the same chip cluster. One such instance might be chips 4 and 6 shown in FIG. 29. The signals between chips 4 and 6 ($SC_{4,6}$) may be routed serially through chips 1, 3, and 5. Also, the orientation of chips along the path between chips 4 and 6 may be changed to bring chips 4 and 6 into an adjacent relationship, or close thereto, by reassigning one or more sets of interface sides. For example, the link #6 for the interface sides for chips 3 and 5 may be reassigned as shown in FIG. 31 to bring chip 6 closer to chip 4, and where the signals between chips 4 and 6 may be routed through chip 5, which provides a shorter route than that provided serially through chips 5, 3, and 1.

After finishing step #6, a single chip cluster should result, provided that the chips are not from two or more disjointed circuits. A number of possible resolutions may occur with implementing these above approaches, in which case the approach that provides the most compact layout may be chosen.

Step #7: As an optional step, the layout may be compacted by re-configuring isolated portions of the chip cluster, as long as such operations do not cause conflicts.

Step #8: With the chip configuration set, the metalization layers of the chips are then laid out in order to implement the routing of the signals in the system using standard routing and layout procedures well known in the art, as previously described with reference to FIG. 20. These procedures may be implemented by several software programs available in the industry. One or more metalization layers (or equivalent) of each chip may be used. Preferably, the routing of pass-through signals is done first as these signals are in most need of the routing flexibility provided by the carrier system of the present invention.

Routing of Pass-Through Signal Traces.

Figure 32:
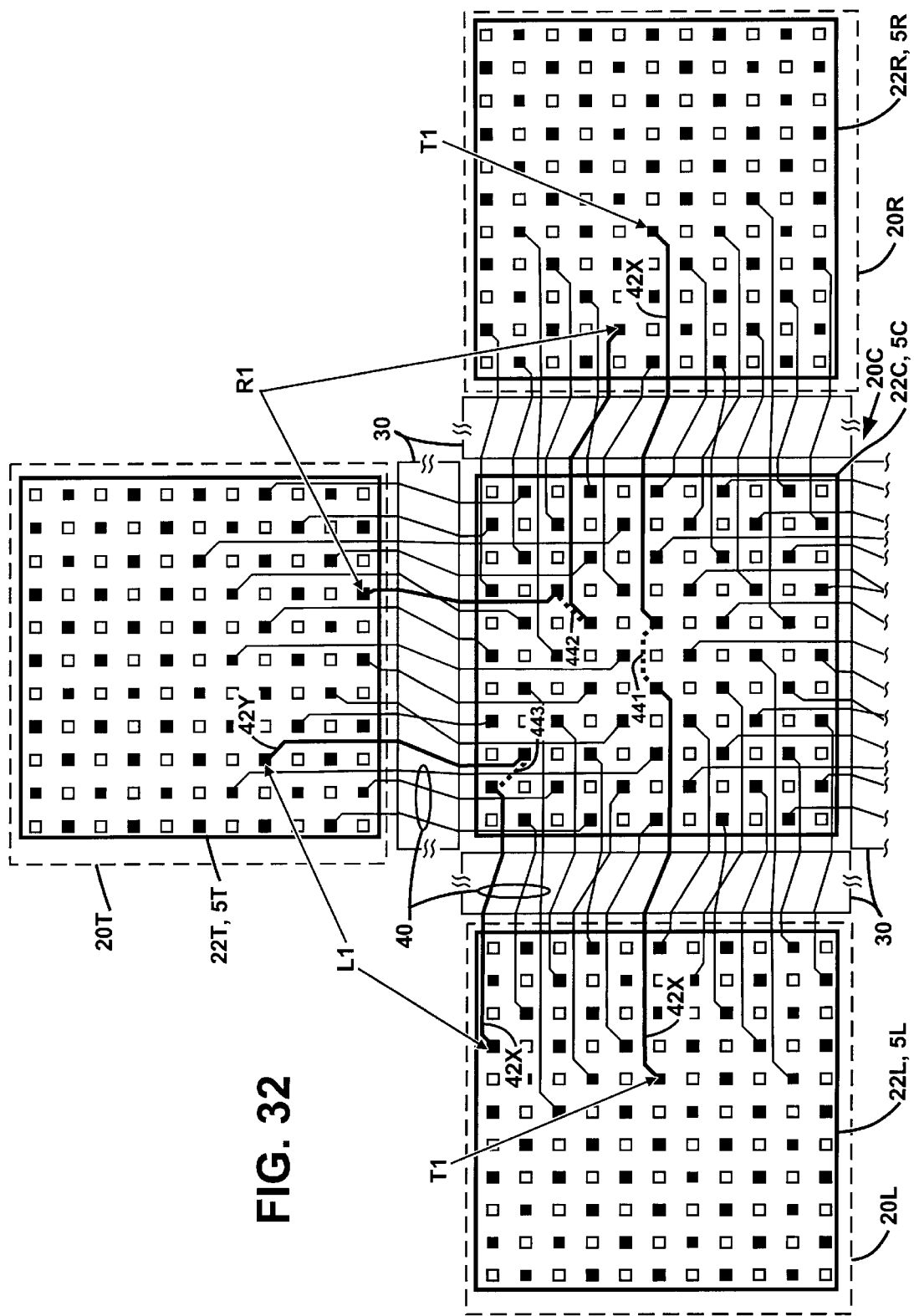
FIG. 32 is a top plan view of the inner pad arrays of a chip carrier and three of its adjacent carriers showing the formation of traces which pass through the common chip and which have their ends on the adjacent chip carriers according to the present invention.

FIG. 32 is a top plan view of the inner pad arrays 22C of a chip carrier 20C and inner pad arrays 22L, 22R, and 22T of three of its adjacent carriers 20L, 20R, and 20T, respectively. FIG. 32 shows the formation of three types of composite traces T1, L1, and R1 which carry signals between the adjacent chip carriers and which pass through center chip carrier 22C. Corresponding chips 5C, 5L, 5R, and 5T are placed over the inner pad arrays of carriers 22C, 22L, 22R, 22T, respectively of the carriers. (The chip boundaries substantially correspond to the boundaries of the pad arrays 22, but this need not be the case.) For the sake of visual simplicity, the carriers 20C, 20L, 20R, and 20T are shown in abbreviated schematic form by dashed outlines with the understanding that the full top plan view of the carriers has been provided in previous figures. Likewise, the bridge connectors 30 between carriers 20C, 20L, 20R, and 20T are shown in abreviated schematic form.

Each composite pass-through trace T1, R1, and L1 uses selected traces 42X, 42Y of the chip carriers 20, selected traces 40 of bridge connectors 30, and a trice formed on one or more metalization layers of chip 5C. For example, a pass-through signal trace T1 originates at a pad from the middle of left carrier array 22L, is carried to a pad in the middle of carrier array 22C by a carrier trace 42X of carrier 20L, a bridge trace 40, and a carrier trace 42X of carrier 20C. The composite pass-through trace T1 is then connected to a signal trace 441 formed in a metalization layer of chip 5C, which carries the signal over to a second trace 42X of carrier 20C. From this second trace 42X, composite signal trace T1 is carried over the middle of array 22R by a bride trace 40 and a trace 42X on carrier 20R.

Trace 441 can be configured among the pads of array 22C to provide a wide variety of pass-through signals between carrier arrays 22L and 22R. To function in providing composite trace T1, trace 441 need not be connected to any active circuitry on chip 5C. Of course, if the signal carried by composite trace T1 is intended to connect to active circuitry on both chips 5C and 5R, then trace 441 may be constructed to connect to the intended circuitry on IC chip SC. In pure pass-through cases, trace 441 is electrically isolated from the active circuitry (e.g. transistors) of chip 5C, even though the trace overlays such active circuitry (e.g. transistors).

In a similar manner, composite traces R1 and L1 may be formed with corresponding traces 442 and 443 on chip 5L. Like trace 441, traces 442 and 443 may overly active circuitry (e.g., transistor) of Chip 5C while being electrically isolated from this circuitry.

As before, signals from each of carriers 20L and 22R may connected to signals on of the chip 5C on carrier 20C by the previously described connection structure. Such connections are shown in FIG. 32 along with composite traces R1, L1, and T1.

Figure 33:
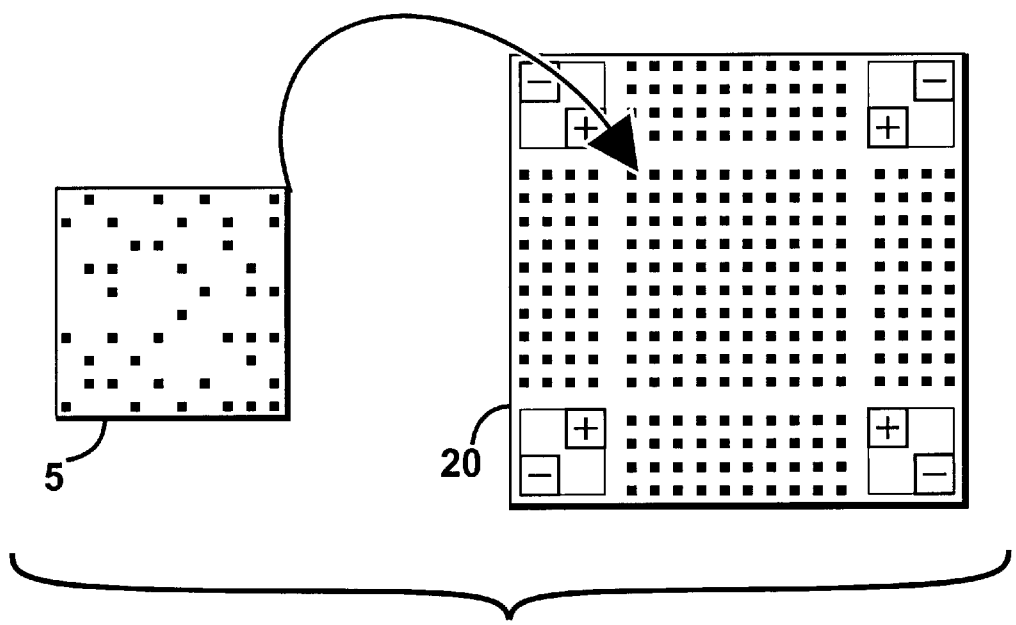
FIG. 33 shows an exemplary integrated circuit chip with the interconnect pads required for it to operate in a universal multichip interconnection system according to the present invention.

With the above configurations, the number of pads in inner array 22 of the chip carrier 20 exceeds the number needed by the integrated circuit chip, generally by a factor of two, more preferably by a factor of three, and in some cases by a factor of four or more. Exceeding the number by a factor of two or more, provides greater flexibility in choosing the routing connections to effect the configuration of the entire system. With inner array 22 of carrier 20 having nearly equal numbers of signal pads and power supply pads, the number of signal pads in inner array 22 exceeds those needed by the chip (generally by the same factors as above), and the number of power supply pads in inner array 22 exceeds those needed by the chip (also generally by the same amount). If an integrated circuit chip does not fill the entire area of inner array 22, the above numbers may be stated with respect to the actual area taken up by the chip. FIG. 33 shown an exemplary chip 5 with the interconnect pads required for it to operate in the system. The exemplary chip 5 is show adjacent to an exemplary chip carrier 20 which will hold it. As can be seen, the pads on the inner array of the carrier 20 exceeds those needed by the chip by a factor of approximately 3. Also, the distribution of the pads on the IC chip is irregular (i.e., lacks any type of symmetry), in contrast to the full array of carrier 20. The irregular nature is due to the fact that one of the metalization layers of the IC chip (preferably the last layer) is being customized to implement the interconnection of the signal lines of the system. Most of the IC chips, if not all, in a system using the interconnect approach of the present invention will have an irregular distribution of their pads over their surfaces.

Figure 34:
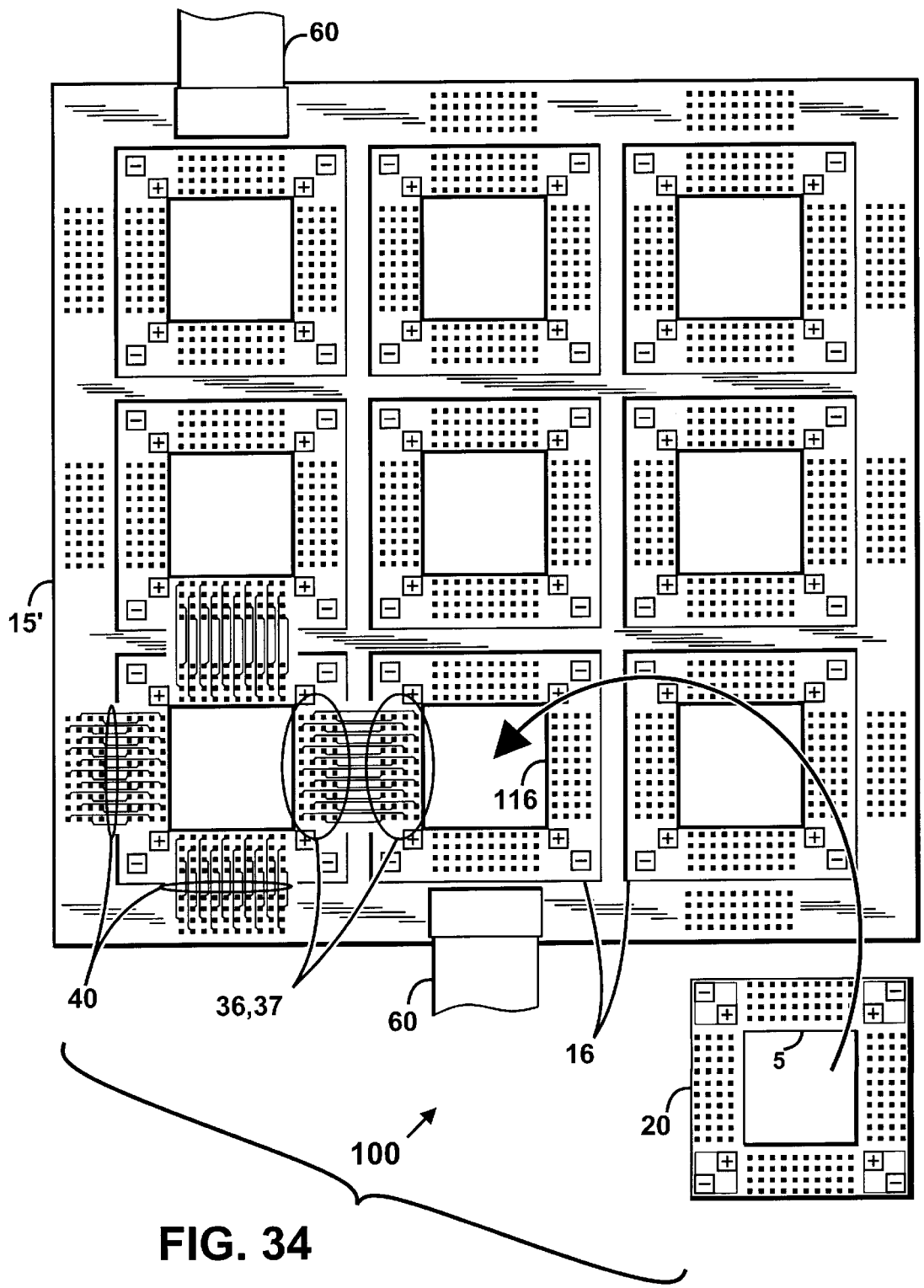
FIG. 34 is a top plan view of a second general exemplary embodiment of the universal multichip interconnection system according to the present invention.

FIG. 34 shows a second general system embodiment according to the present invention at 100. System 100 is similar in construction to system 10 shown in the previous embodiments with the following differences. First, the traces 40 and pads 36 and 37 of bridge connectors are integrated into main board 15 to create a modified main board 15'. Traces 40 are embedded within board 15, but those traces associated with the carrier recess 16 at the lower left-hand corner have been shown in exposed form. As another difference, array of pads for formed at the edged of main board 15' for interconnectors 60 to connect to. Carriers 20 and chips 5 are used and configured as before, but the assembled carriers are placed face down into recess 16, and are flip-chip bonded. As another difference, an inner recess 116 is formed within each carrier recess 16 so as to accommodate the height of chip 5. The power connections at the comers of the carriers 20 may be solder bonded (as in the flip-chip bonding process), or the leaf spring contacts used in power connectors 50 may be transferred to main board 15'. As an optional difference, recesses 16 may be omitted.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A multichip module for constructing an electronic system from separate integrated circuit chips, said electronic system having at least a first group of circuits, a second group of circuits, a third group of circuits, and a set of electrical connections which interconnect the groups of circuits together, said module comprising:
   a first chip carrier having a plurality of first pads formed in a central area of said surface and for coupling to an IC chip, a plurality of second pads formed at the periphery of said surface, and a wiring pattern comprising a set of X-signal lines and a set of Y-signal lines, said X-signal and Y-signal lines being coupled between pads in said central area and said periphery area;
   a second chip carrier which comprises the pad and wiring construction of said first chip carrier;
   a third chip carrier which comprises the pad and wiring construction of said first chip carrier;
   a first interconnect means for electrically coupling a number of said second pads of said first carrier to a corresponding number of second pads of said second carrier with a corresponding number of electrical traces, said first interconnect means providing more electrical traces between said first and second carriers than that required by the electronic system;
   a second interconnect means for electrically coupling a number of said second pads of said first carrier to a corresponding number of second pads of said third carrier with a corresponding number of electrical traces, said second interconnect means providing more electrical traces between said first and third carriers than that required by the electronic system;
   a first integrated circuit chip comprising the first group of circuits of the electronic system, said first chip having a plurality of input signals and output signals routed to corresponding interconnect pads formed at the chip's top surface, said interconnect pads being positioned so as to coupled to selected ones of said first pads of said first carrier;
   a second integrated circuit chip comprising the second group of circuits of the electronic system, said second chip having a plurality of input signals and output signals routed to corresponding interconnect pads formed at the chip's top surface, said interconnect pads being positioned so as to coupled to selected ones of said first pads of said second carrier;
   a third integrated circuit chip comprising the third group of circuits of the electronic system, said third chip having a plurality of input signals and output signals routed to corresponding interconnect pads formed at the chip's top surface, said interconnect pads being positioned so as to coupled to selected ones of said first pads of said third carrier;
   wherein the routing of the signals of each said integrated circuit chip to the chip's interconnect pads and the positioning of each chip's interconnect pads are selected to form the electrical connections of the electronic system.

2. The multichip module of claim 1 wherein at least two of the integrated-circuit chips are not identical.

3. The multichip module of claim 1 wherein at least two of the integrated-circuit chips have no more than 10% of their circuitry being identical.

4. The multichip module of claim 1 wherein said wiring pattern of said first chip carrier has 90-degree rotational symmetry about a central point of said central area.

5. The multichip module of claim 1 wherein the first integrated-circuit chip overlays a first area of said central area of said first carrier, and wherein the number of first pads in said central area exceeds the number of pads on the first integrated-circuit chip by a factor of approximately 2.

6. The multichip module of claim 1 wherein said central area of said first carrier has a center point and a perimeter; and wherein at least ten percent of the first pads of said first carrier set are disposed closer to said center point than said perimeter.

7. A multichip module for constructing a electronic system from separate integrated circuit chips, said module comprising:

a first chip carrier having a plurality of first pads formed in a central area of said surface and for coupling to an IC chip, a plurality of second pads formed at the periphery of said surface, and a wiring pattern comprising a set of X-signal lines and a set of Y-signal lines, said X-signal and Y-signal lines being coupled between pads in said central area and said periphery area, said wiring pattern having 90-degree rotational symmetry about a central point of said central area;

a second chip carrier which comprises the pad and wiring construction of said first chip carrier;

a third chip carrier which comprises the pad and wiring construction of said first chip carrier;

a first interconnect means for electrically coupling a number of said second pads of said first carrier to a corresponding number of second pads of said second carrier with a corresponding number of electrical traces;

a second interconnect means for electrically coupling a number of said second pads of said first carrier to a corresponding number of second pads of said third carrier with a corresponding number of electrical traces, each of said first and second interconnect means having a common pad connectivity such that they may be interchanged without changing the connectivity between said first, second, and third chip.

8. The multichip module of claim 7 wherein said central area of said first carrier has a center point and a perimeter; and wherein at least ten percent of the first pads of said first carrier set are disposed closer to said center point than said perimeter.

9. A multichip module comprising:

a first integrated-circuit chip carrier having a first output signal conveyed by a first electrical trace;

a second integrated-circuit chip carrier separate from said first carrier and having a first input signal conveyed by a second electrical trace;

a third integrated-circuit chip carrier having a first surface, a first plurality of pads formed in a central area of said first surface and for coupling to the top surface of an integrated-circuit chip, and a second plurality of pads formed at the periphery of said surface for coupling to two or more bridge connectors, said third carrier further having a third electrical trace and fourth electrical trace, said third trace having a first end terminating at a first pad in said central area and a second end terminating at the periphery of said carrier surface, said fourth trace having a first end terminating at a second pad in said central area and a second end terminating at the periphery of said carrier surface;

a first bridge connector which spans between said first and third carriers and which comprises a fifth electrical trace which electrically connects said first trace of said first carrier to said third trace of said third carrier;

a second bridge connector which spans between said second and third carriers and which comprises a sixth electrical trace which electrically connects said second trace of said second carrier to said fourth trace of said third carrier;

an integrated-circuit chip having a plurality of transistors formed on its surface and a metalization layer overlaying a number of said transistor devices and insulated therefrom by at least one dielectric layer, said metal layer comprising a seventh electrical trace which electrically couples said first and second pads in the central area of said third carrier when said integrated circuit chip is flip-chip mounted to said third integrated circuit carrier, said seventh electrical trace conveying said output signal from said first carrier to the input signal of said second carrier through said third carrier and said integrated-circuit chip.

10. The multichip module of claim 9 wherein said first chip carrier has a second output signal conveyed by an eighth electrical trace, wherein said third chip carrier further has a ninth trace having a first end terminating at a third pad in said central area and a second end terminating at the periphery of said carrier surface, and wherein said first bridge connector further comprises a tenth electrical trace which electrically connects said eighth trace from said first chip carrier to said ninth trace of said third carrier package, and wherein said integrated-circuit chip comprises a pad which connects to said third pad of said third chip carrier and which receives the second output signal thereon as an input.

11. A universal chip carrier holding an integrated-circuit chip, said carrier comprising:

a surface for interconnecting to an IC chip;

a first plurality of pads formed in a central area of said surface and for coupling to the IC chip;

a second plurality of pads formed at the periphery of said surface;

a wiring pattern comprising a set of X-signal lines and a set of Y-signal lines, said X-signal and Y-signal lines being coupled between pads in said central area and said periphery area, said signal lines being formed on at least two separate conductive layers which are separated by at least one dielectric layer;

means for coupling power and ground potentials to selected pads in said central area; and wherein the IC chip overlays a first area of said central area, and wherein the number of pads in said first area exceeds the number of pads on the IC chip.

12. The chip carrier of claim 11 wherein the number of pads in said first area exceeds the number of pads on the IC chip by a factor of at least 3.

13. The chip carrier of claim 11 wherein said central area has a center point, and wherein said wiring pattern has 90-degree rotational symmetry about said center point.

14. The carrier of claim 11 wherein said central area has a center point and a perimeter, and wherein at least ten percent of the pads in said central area are disposed closer to said center point than said perimeter of said central area.

15. The carrier of claim 11 wherein the pads in said central area are arranged in a plurality of groups, each group having a power pad, a ground pad, and at least one signal pad, said groups being arranged next to one another such that power, ground, and signal pads are provided uniformly over said central area.

16. A universal chip carrier for holding one or more integrated-circuit chips, said carrier comprising:

a surface for interconnecting to an IC chip, said surface having a central area, a periphery, and four edges at said periphery, said center area having a center point and a perimeter;

four sets of inside signal pads disposed in the central area of said surface and arranged in a first pattern that has 90-degree rotational symmetry about said center point, said inside signal pads capable of conveying signals to and from the chip, at least ten percent of the pads of said first set being disposed closer to said center point than said perimeter, each set of inside pads having an arrangement pattern of its pads, the pattern of each set coinciding with the pattern of another set if it were rotated by 90 degrees about said center point;

four sets of outside signal pads, each set being disposed at a respective edge of said carrier and having a common pad arrangement;

four sets of electrical traces, each set coupling a respective set of inside signal pads to a respective set of outside signal pads and providing a connectivity between said respective sets of inside and outside signal pads, each set of electrical traces providing the same connectivity between its associated inside and outside signal pads as another set of electrical traces if said set of electrical traces and respective inside and outside signal pads were rotated by 90 degrees; and wherein said four sets of electrical traces are collectively formed on at least two separate conductive layers which are separated by at least one dielectric layer.

17. The carrier of claim 16 further comprising a set of first power supply pads in the central area disposed in a second pattern that has 90-degree rotational symmetry about said center point, said set of first power supply pads being arranged so as to not overlap with said inside signal pads, said set of first power supply pads being electrical coupled to one another at a first common potential and being capable of conveying said first common potential to the IC chip.

18. The carrier of claim 17 wherein at least ten percent of the first power supply pads are disposed closer to said center point than said perimeter of said central area.

19. The carrier of claim 17 further comprising a set of second power supply pads in the central area disposed in a third pattern that has 90-degree rotational symmetry about said center point, said set of second power supply pads being arranged so as to not overlap with said inside signal pads or said first power supply pads, said set of second power supply pads being electrically coupled to one another at a second common potential and being capable of conveying said second common potential to the IC chip.

20. The carrier of claim 19 wherein at least ten percent of the pads of said first set are disposed closer to said center point than said perimeter of said central area.

21. The carrier of claim 16 wherein said surface comprises four corners, each corner being disposed between two of said edges, and wherein a first power input pad electrically connected to said first power supply pads is disposed at each said corner, and wherein a second power input pad electrically connected to said second power supply pads is disposed at each said corner.

22. The carrier of claim 16 wherein the pads in said central area are arranged in a plurality of groups, each group having a power pad, a ground pad, and at least one signal pad, said groups being arranged next to one another such that power, ground, and signal pads are provided uniformly over said central area.

23. A universal chip carrier holding an integrated-circuit chip, said carrier comprising:

a surface for interconnecting to an IC chip, said surface having a central area, a periphery, and four edges at said periphery, said center area having a center point and a perimeter;

four sets of inside signal pads disposed in the central area of said surface and arranged in a first pattern that has 90-degree rotational symmetry about said center point, said inside signal pads capable of conveying signals to and from the chip, at least ten percent of the pads of said first set being disposed closer to said center point than said perimeter, each set of inside pads having an arrangement pattern of its pads, the pattern of each set coinciding with the pattern of another set if it were rotated by 90 degrees about said center point;

four sets of outside signal pads, each set being disposed at a respective edge of said carrier and having a common pad arrangement;

four sets of electrical traces, each set coupling a respective set of inside signal pads to a respective set of outside signal pads and providing a connectivity between said respective sets of inside and outside pads, each set of electrical traces providing the same connectivity between its associated inside and outside signal pads as another set of electrical traces if said set of electrical traces and respective inside and outside signal pads were rotated by 90 degrees; and wherein the IC chip overlays a first area of said central area, and wherein the number of pads in said first area exceeds the number of pads on the IC chip by a factor of at least 2.

24. The carrier of claim 23 further comprising a set of first power supply pads in the central area disposed in a second pattern that has 90degree rotational symmetry about said center point, said set of first power supply pads being arranged so as to not overlap with said inside signal pads, said set of first power supply pads being electrically coupled to one another at a first common potential and being capable of conveying said first common potential to the IC chip.

25. The carrier of claim 24 wherein at least ten percent of the first power supply pads are disposed closer to said center point than said perimeter of said central area.

26. The carrier of claim 24 further comprising a set of second power supply pads in the central area disposed in a third pattern that has 90-degree rotational symmetry about said center point, said set of second power supply pads being arranged so as to not overlap with said inside signal pads or said first power supply pads, said set of second power supply pads being electrically coupled to one another at a second common potential and being capable of conveying said second common potential to the IC chip.

27. The carrier of claim 26 wherein at least ten percent of the pads of said first set are disposed closer to said center point than said perimeter of said central area.

28. The carrier of claim 23 wherein said surface comprises four corners, each corner being disposed between two of said edges, and wherein a first power input pad electrically connected to said first power supply pads is disposed at each said corner, and wherein a second power input pad electrically connected to said second power supply pads is disposed at each said corner.

29. The carrier of claim 23 wherein the pads in said central area are arranged in a plurality of groups, each group having a power pad, a ground pad, and at least one signal pad, said groups being arranged next to one another such that power, ground, and signal pads are provided uniformly over said central area.

30. A universal chip carrier for holding one or more integrated-circuit chips, said carrier comprising:

a surface for interconnecting to an IC chip, said surface having a central area, a periphery, and four edges at said periphery, said center area having a center point and a perimeter;

four sets of inside signal pads disposed in the central area of said surface and arranged in a first pattern that has 90-degree rotational symmetry about said center point, said inside signal pads capable of conveying signals to and from the chip, at least ten percent of the pads of said first set being disposed closer to said center point than said perimeter, each set of inside pads having an arrangement pattern of its pads, the pattern of each set coinciding with the pattern of another set if it were rotated by 90 degrees about said center point;

four sets of outside signal pads, each set being disposed at a respective edge of said carrier and having a common pad arrangement;

four sets of electrical traces, each set coupling a respective set of inside signal pads to a respective set of outside signal pads and providing a connectivity between said respective sets of inside and outside signal pads, each set of electrical traces providing the same connectivity between its associated inside and outside signal pads as another set of electrical traces if said set of electrical traces and respective inside and outside signal pads were rotated by 90 degrees;

a set of first power supply pads in the central area disposed in a second pattern that has 90-degree rotational symmetry about said center point, said first set of supply pads being arranged so as to not overlap with said inside signal pads, said first set of supply pads being electrically coupled to one another at a first common potential and being capable of conveying said first common potential to the IC chip; and a set of second power supply pads in the central area disposed in a third pattern that has 90-degree rotational symmetry about said center point, said second set of supply pads being arranged so as to not overlap with said inside signal pads or said first power supply pads, said second set of supply pads being electrically coupled to one another at a second common potential and being capable of conveying said second common potential to the IC chip.

31. The carrier of claim 30 wherein at least ten percent of said first power supply pads are disposed closer to said center point than said perimeter of said central area.

32. The carrier of claim 30 wherein said surface comprises four corners, each corner being disposed between two of said edges, and wherein a first power input pad electrically connected to said first power supply pads is disposed at each said corner, and wherein a second power input pad electrically connected to said second power supply pads is disposed at each said corner.

33. A universal chip carrier for holding one or more integrated-circuit chips, said carrier comprising:

a surface for interconnecting to an IC chip, said surface having a central area, a periphery, and four edges at said periphery, said center area having a center point and a perimeter;

four sets of inside signal pads disposed in the central area of said surface and arranged in a first pattern that has 180-degree rotational symmetry about said center point, said inside signal pads capable of conveying signals to and from the chip, at least ten percent of the pads of said first set being disposed closer to said center point than said perimeter, each set of inside pads having an arrangement pattern of its pads, the pattern of each set coinciding with the pattern of another set if it were rotated by 180 degrees about said center point;

four sets of outside signal pads, each set being disposed at a respective edge of said carrier and having a common pad arrangement;

four sets of electrical traces, each set coupling a respective set of inside signal pads to a respective set of outside signal pads and providing a connectivity between said respective sets of inside and outside signal pads;

a set of first power supply pads in the central area disposed in a second pattern that has 180-degree rotational symmetry about said center point, said first set of supply pads being arranged so as to not overlap with said inside signal pads, at least ten percent of said first power supply pads being disposed closer to said center point than said perimeter of said central area, said first set of supply pads being electrically coupled to one another at a first common potential and being capable of conveying said first common potential to the IC chip;

a set of second power supply pads in the central area disposed in a third pattern that has 180-degree rotational symmetry about said center point, said second set of supply pads being arranged so as to not overlap with said inside signal pads or said first power supply pads, at least ten percent of said first power supply pads being disposed closer to said center point than said perimeter of said central area, said second set of supply pads being electrically coupled to one another at a second common potential and being capable of conveying said second common potential to the IC chip.

34. The carrier of claim 33 wherein said first pattern has 90-degree rotational symmetry about said center point.

35. The carrier of claim 33 wherein said second pattern has 90-degree rotational symmetry about said center point.

36. The carrier of claim 33 wherein each of said first, second, and third patterns has 90-degree rotational symmetry about said center point.

37. The carrier of claim 33 wherein the pads disposed in said central area are arranged in a rectangular grid pattern with a red-black ordering arrangement, each of said inside signal pads being located on one of the red locations, and each of said power supply pads being located on one of the black locations.

38. The carrier of claim 33 wherein said first supply pads are arranged in diamond configurations.

39. The carrier of claim 33 wherein said first supply pads are arranged in X-shape configurations.

40. The carrier of claim 33 wherein said first supply pads are arranged in cross (+)-shape configurations.

41. The carrier of claim 33 wherein the pads disposed in said central area are arranged in a rectangular grid pattern with red-black ordering arrangement, each of said inside signal pads being located on one of the red locations, and each of said power supply pads being located on one of the black locations.

42. The carrier of claim 33 wherein the pads disposed in said central area are arranged in a rectangular grid pattern with an even number of pads on each side of the rectangular pattern, wherein the rectangular pattern may be divided into four quadrants, wherein the pads in each quadrant are arranged with a red-black ordering with each of said inside signal pads being located on one of the red locations and each of said power supply pads being located on one of the black locations, and wherein the red-black ordering pattern of each quadrant coincides with the red-black ordering pattern of an adjacent quadrant if it were rotated by 90 degrees about said center point.

43. The carrier of claim 33 wherein said surface comprises four corners, each corner being disposed between two of said edges, and wherein a first power input pad electrically connected to said first power supply pads is disposed at each said corner, and wherein a second power input pad electrically connected to said second power supply pads is disposed at each said corner.

44. A method of interconnecting integrated-circuit (IC) chips in a multichip module comprising the steps of:

providing a plurality of identical chip carriers, each carrier having a plurality of first pads disposed at its center for coupling to an IC chip, a plurality of second pads disposed around its periphery, and a wiring pattern of electrical interconnections among said pads;

providing a plurality of inter-carrier connection means, each connection means for interconnecting at least two chip carriers at a selected number of their second pads;

interconnecting each chip carrier with at least one other chip carrier with one or more of said inter-carrier connection means;

customizing the routing of signals to each IC chip and among the IC chips by coupling a selected number of pads in said first set of pads of each said chip carrier to a corresponding set of pads on a corresponding IC chip, and by forming a custom wiring pattern between a selected number of the pads one at least on of said IC chips.

45. The method of claim 10 further comprising the step of forming a jumper connection on an IC chip between two pads of said IC chip, said jumper connection being substantially electrically isolated from the active circuitry of said IC chip.

* * * * *